United States Patent
Sung et al.

(10) Patent No.: US 11,800,753 B2
(45) Date of Patent: *Oct. 24, 2023

(54) DISPLAY DEVICE AND METHOD FOR FABRICATING THE SAME

(71) Applicant: SAMSUNG DISPLAY CO., LTD., Yongin-si (KR)

(72) Inventors: Wooyong Sung, Seoul (KR); Sooyoun Kim, Siheung-si (KR); Seunghun Kim, Hwaseong-si (KR); Junghan Seo, Seoul (KR); Seungho Yoon, Hwaseong-si (KR); Hyoungsub Lee, Yongin-si (KR); Moonwon Chang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 250 days.

This patent is subject to a terminal disclaimer.

(21) Appl. No.: 17/240,263

(22) Filed: Apr. 26, 2021

(65) Prior Publication Data

US 2021/0249488 A1    Aug. 12, 2021

Related U.S. Application Data

(63) Continuation of application No. 16/259,809, filed on Jan. 28, 2019, now Pat. No. 10,991,774.

(30) Foreign Application Priority Data

Feb. 12, 2018    (KR) ........................ 10-2018-0016676

(51) Int. Cl.
  *G02B 5/30*    (2006.01)
  *H10K 59/122*  (2023.01)
  (Continued)

(52) U.S. Cl.
  CPC ......... *H10K 59/122* (2023.02); *G02B 5/3025* (2013.01); *H04N 23/55* (2023.01);
  (Continued)

(58) Field of Classification Search
  CPC .. H10K 71/231; H10K 50/841; H10K 50/805; H10K 50/8428; H10K 50/86;
  (Continued)

(56) References Cited

U.S. PATENT DOCUMENTS 8,610,842 B2   12/2013   Kim et al.
8,947,627 B2   2/2015    Rappoport et al.
(Continued)

FOREIGN PATENT DOCUMENTS

EP    2 448 243 A2    5/2012
EP    2 448 243 A3    9/2012
(Continued)

OTHER PUBLICATIONS

Extended European Search Report for corresponding European Patent Application No. 19156646.2, dated Jun. 18, 2019, 21 pages.

*Primary Examiner* — William R Alexander
(74) *Attorney, Agent, or Firm* — Lewis Roca Rothgerber Christie LLP

(57) ABSTRACT

A display device capable of improving reliability (e.g., impact resistance) of a display panel having a through-hole, and a method of manufacturing a display device are provided. A display device includes: a camera module including a lens; a display panel including a through-hole overlapping the camera module on a plane; a window glass on the display panel; and a filling member in the through-hole and opposing each of the camera module and the window glass. A refractive index difference between an end portion of the filling member and the lens is about 0.7 or less, and a
(Continued)

refractive index difference between another end portion of the filling member and the window glass is about 0.5 or less.

17 Claims, 18 Drawing Sheets

(51) Int. Cl.
  *H04N 23/55* (2023.01)
  *H04N 23/57* (2023.01)
  *H10K 50/86* (2023.01)
  *H10K 50/805* (2023.01)
  *H10K 50/813* (2023.01)
  *H10K 50/84* (2023.01)
  *H10K 50/842* (2023.01)
  *H10K 59/00* (2023.01)
  *H10K 71/20* (2023.01)
  *H10K 71/00* (2023.01)

(52) U.S. Cl.
  CPC ........... *H04N 23/57* (2023.01); *H10K 50/805* (2023.02); *H10K 50/813* (2023.02); *H10K 50/841* (2023.02); *H10K 50/8426* (2023.02); *H10K 50/8428* (2023.02); *H10K 50/86* (2023.02); *H10K 59/00* (2023.02); *H10K 71/231* (2023.02); *H10K 71/851* (2023.02)

(58) Field of Classification Search
  CPC ............. H10K 50/8426; H10K 50/813; H10K 59/122; H10K 59/00; H04N 23/57; H04N 23/55; G02B 5/3025; G02B 5/30
  USPC .......................................................... 359/894
  See application file for complete search history.

(56) References Cited

U.S. PATENT DOCUMENTS

| | | | |
|---|---|---|---|
| 9,075,199 | B2 | 7/2015 | Jiao et al. |
| 9,543,364 | B2 | 1/2017 | Rappoport et al. |
| 10,067,398 | B2 | 9/2018 | O'Keeffe |
| 10,153,235 | B2 | 12/2018 | Jung et al. |
| 10,824,025 | B2 | 11/2020 | O'Keeffe |
| 2010/0232037 | A1 | 9/2010 | Do |
| 2012/0105400 | A1 | 5/2012 | Mathew et al. |
| 2013/0258234 | A1 | 10/2013 | Park et al. |
| 2016/0026061 | A1 | 1/2016 | O'Keeffe |
| 2017/0026553 | A1 | 1/2017 | Lee et al. |
| 2017/0117336 | A1 | 4/2017 | Rappoport et al. |
| 2017/0208241 | A1 | 7/2017 | Choi et al. |
| 2018/0130750 | A1* | 5/2018 | Jung .................. H01L 23/5389 |
| 2018/0373112 | A1 | 12/2018 | O'Keeffe |

FOREIGN PATENT DOCUMENTS

| | | |
|---|---|---|
| JP | 2012-98726 | 5/2012 |
| KR | 10-1406129 | 6/2014 |
| KR | 2015-0039024 | 4/2015 |
| KR | 10-1821561 | 1/2018 |

* cited by examiner

DISPLAY DEVICE AND METHOD FOR FABRICATING THE SAME

CROSS-REFERENCE TO RELATED APPLICATIONS

This application is a continuation of U.S. patent application Ser. No. 16/259,809, filed on Jan. 28, 2019, which claims priority to and the benefit of Korean Patent Application No. 10-2018-0016676, filed on Feb. 12, 2018 in the Korean Intellectual Property Office (KIPO), the entire disclosures of both of which are incorporated by reference herein.

BACKGROUND

1. Field

Aspects of embodiments of the present invention relate to a display device and a method of manufacturing a display device.

2. Discussion of Related Art

Flat panel display ("FPD") devices are advantageous in that they may reduce weight and volume, which are disadvantages of cathode ray tubes ("CRT"). Examples of the FPD devices may include liquid crystal display ("LCD") devices, field emission display ("FED") devices, plasma display panel ("PDP") devices, organic light emitting diode ("OLED") display devices, and the like.

Between the FPD devices, the OLED display device displays images using an OLED which may generate light by recombination of electrons and holes.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

According to aspects of embodiments of the present invention, a display device having improved reliability (e.g., impact resistance) of a display panel having a through-hole, and a method of manufacturing such a display device, are provided.

According to one or more embodiments of the present invention, a display device includes: a display panel including a through-hole; a window glass on the display panel; and a filling member in the through-hole and opposing the window glass. The through-hole overlaps a camera module that includes at least one lens, the filling member opposes the camera module, a refractive index difference between an end portion of the filling member and the lens is about 0.7 or less, and a refractive index difference between another end portion of the filling member and the window glass is about 0.5 or less.

According to one or more embodiments of the present invention, a display device includes: a display panel including a through-hole; a window glass on the display panel; and a filling member in the through-hole and opposing the window glass. The through-hole overlaps a camera module that includes at least one lens, and the filling member contacts the lens.

According to one or more embodiments of the present invention, a method of manufacturing a display device includes: forming a display panel; defining a through-hole that passes through the display panel and overlaps a camera module on a plane; arranging a window glass on the display panel defined with the through-hole; and filling the through-hole with a filling member. The filling member filled in the through-hole opposes each of the camera module and the window glass, and a refractive index difference between an end portion of the filling member and a lens of the camera module is about 0.7 or less, and a refractive index difference between another end portion of the filling member and the window glass is about 0.5 or less.

According to one or more embodiments of the present invention, a method of manufacturing a display device includes: forming a display panel; defining a through-hole that passes through the display panel and overlaps a camera module on a plane; arranging a window glass on the display panel defined with the through-hole; filling the through-hole with a filling member; and bringing a lens of the camera module in contact with the filling member filled in the through-hole. The filling member filled in the through-hole opposes each of the camera module and the window glass.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

A more complete appreciation of the present invention will become more apparent by describing in further detail some embodiments thereof with reference to the accompanying drawings, wherein.

DETAILED DESCRIPTION

Figure 1A:
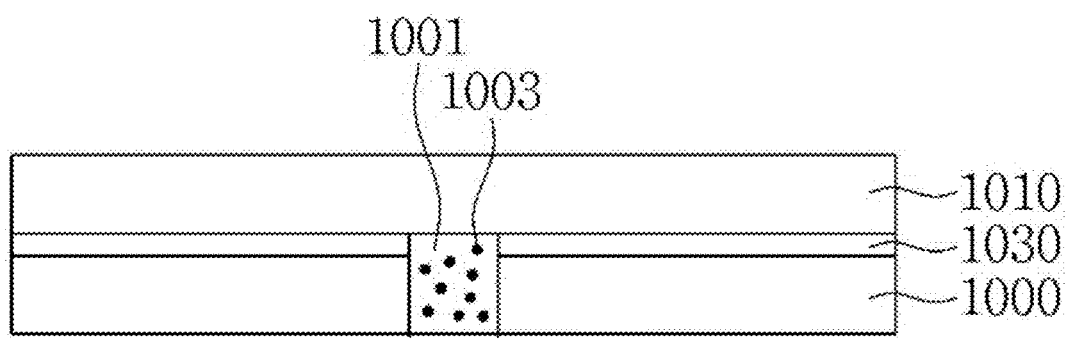
FIG. 1A is a schematic view illustrating a display device according to an embodiment of the present invention.

Some embodiments will now be described more fully herein with reference to the accompanying drawings. Although the invention may be modified in various manners and have several embodiments, some embodiments are illustrated in the accompanying drawings and will be mainly described in the specification. However, the scope of the invention is not limited to the embodiments and should be construed as including all the changes, equivalents, and substitutions included in the spirit and scope of the invention.

In the drawings, thicknesses of layers and areas may be illustrated in an enlarged manner for clarity and ease of description thereof. When a layer, area, or plate is referred to as being "on" another layer, area, or plate, it may be directly on the other layer, area, or plate, or one or more intervening layers, areas, or plates may be present therebetween. Conversely, when a layer, area, or plate is referred to as being "directly on" another layer, area, or plate, intervening layers, areas, or plates are absent therebetween. Further, when a layer, area, or plate is referred to as being "below" another layer, area, or plate, it may be directly below the other layer, area, or plate, or one or more intervening layers, areas, or plates may be present therebetween. Conversely, when a layer, area, or plate is referred to as being "directly below" another layer, area, or plate, intervening layers, areas, or plates are absent therebetween.

The spatially relative terms "below," "beneath," "lower," "above," "upper," and the like, may be used herein for ease of description to describe the relations between one element or component and another element or component as illustrated in the drawings. It is to be understood that the spatially relative terms are intended to encompass different orientations of the device in use or operation, in addition to the orientation depicted in the drawings. For example, in the case in which a device illustrated in the drawing is turned over, the device positioned "below" or "beneath" another device may be "above" another device. Accordingly, the illustrative term "below" may include both the lower and upper positions. The device may also be oriented in other directions and, thus, the spatially relative terms may be interpreted differently depending on the orientations.

Throughout the specification, when an element is referred to as being "connected" to another element, the element may be "directly connected" to the other element, or "electrically connected" to the other element with one or more intervening elements interposed therebetween. It is to be further understood that the terms "comprises," "including," "includes," and/or "including," when used in this specification, specify the presence of stated features, integers, steps, operations, elements, and/or components, but do not preclude the presence or addition of one or more other features, integers, steps, operations, elements, components, and/or groups thereof.

It is to be understood that, although the terms "first," "second," "third," and the like may be used herein to describe various elements, these elements should not be limited by these terms. These terms are used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within ±30%, 20%, 10%, or 5% of the stated value.

Unless otherwise defined, all terms used herein (including technical and scientific terms) have the same meaning as commonly understood by those skilled in the art to which this invention pertains. It is to be further understood that terms, such as those defined in commonly used dictionaries, should be interpreted as having a meaning that is consistent with their meaning in the context of the relevant art and are not to be interpreted in an ideal or excessively formal sense unless clearly defined in the present specification.

Description of some parts which are not associated with the description may not be provided in order to more clearly describe embodiments of the present invention. Like reference numerals refer to like elements throughout the specification.

Herein, a display device and a method of manufacturing the display device according to one or more embodiments of the present invention will be described in further detail with reference to FIGS. 1 to 11.

Figure 1B:
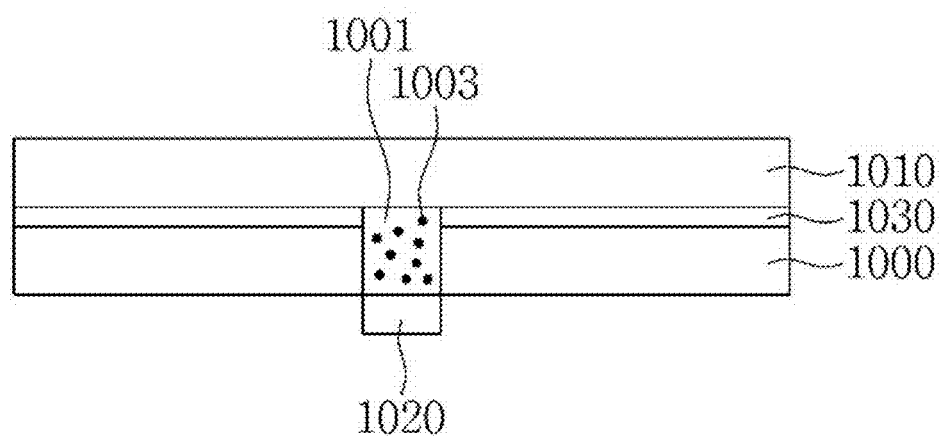
FIG. 1B is a schematic view illustrating a display device and a camera module according to an embodiment of the present invention.

FIG. 1A is a schematic view illustrating a display device according to an embodiment of the present invention, and FIG. 1B is a schematic view illustrating a display device and a camera module according to an embodiment of the present invention.

The display device according to an embodiment of the present invention includes a display module 1000, a window glass 1010, and a filling member 1003, as illustrated in FIG. 1A.

The display module 1000 includes a display panel that has a through-hole 1001. A further detailed description of the configuration of the display module 1000 will be given below.

The window glass 1010 is disposed on the display module 1000 and includes a transparent glass material to transmit an image generated from the display module 1000.

The filling member 1003 includes a transparent material, and is filled in the through-hole 1001 which passes through the display module 1000 to oppose the window glass 1010.

As illustrated in FIG. 1B, the through-hole 1001 overlaps, on a plane, the camera module 1020 that includes at least one lens, and the filling member 1003 opposes the camera module 1020.

The camera module 1020 includes at least one lens, and receives images by receiving light that is input through the lens. The camera module 1020 receives the light through the through-hole 1001.

According to an embodiment of the present invention, the filling member 1003 may contact the lens of the camera module 1020. Herein, the present invention will be described on the basis of the case in which the filling member 1003 contacts the lens of the camera module 1020.

In an embodiment, the filling member 1003 may have a refractive index in a range from about 1.2 to about 2.0. In an embodiment, for example, the refractive index of the camera module 1020 is about 1.7, and the refractive index of the window glass 1010 is about 1.5. The filling member 1003, in an embodiment, may have a refractive index between the refractive index of the window glass 1010 and the refractive index of the lens of the camera module 1020. Accordingly, the refractive index difference between one end portion of the filling member 1003 and the lens of the camera module 1020 and the refractive index difference between another end portion of the filling member 1003 and the window glass 1010 are reduced, and the distortion of light incident to the lens of the camera module 1020 may be improved.

In an embodiment, the filling member 1003 may include an organic material. For example, the organic material may be an acrylic silicon-based organic material.

In an embodiment, the refractive index difference between one end portion of the filling member 1003 and the lens of the camera module 1020 may be about 0.7 or less, and the refractive index difference between another end portion of the filling member 1003 and the window glass 1010 may be about 0.5 or less.

In an embodiment, the filling member 1003 may include a first inorganic material, an organic material, and a second inorganic material that are sequentially stacked. In such an embodiment, the first inorganic material opposes the camera module 1020, and the second inorganic material opposes the window glass 1010. For example, the first inorganic material and the second inorganic material may be at least one of silicon nitride ($SiN_x$), silicon oxide ($SiO_2$), and silicon oxynitride ($SiO_xN_y$). In an embodiment, the organic material may be an acrylic silicon-based organic material.

In an embodiment, the refractive index difference between the first inorganic material and the lens of the camera module 1020 may be about 0.7 or less, and the refractive index difference between the second inorganic material and the window glass 1010 may be about 0.5 or less.

When the filling member 1003 contacts the lens of the camera module 1020 as described above, there is no air gap between the filling member 1003 and the lens of the camera module 1020, and no additional index matching for the presence of the air gap is required. In other words, refractive index adjustment for reducing the refractive index difference between one end portion of the filling member 1003 and the air and the refractive index difference between the air and the lens of the camera module 1020 is not required.

In another embodiment, the filling member 1003 may not contact the lens of the camera module 1020. In such an embodiment, additional index matching may be desired as an air gap is present. In other words, the refractive index adjustment may be desired to reduce the refractive index difference between one end portion of the filling member 1003 and the air and the refractive index difference between the air and the lens of the camera module 1020.

The display device according to an embodiment of the present invention may further include an adhesive unit 1030, which is transparent, disposed between the display module 1000 and the window glass 1010. In such an embodiment, the through-hole 1001 passes through both the display module 1000 and the adhesive unit 1030.

The adhesive unit 1030 attaches the display module 1000 and the window glass 1010 to each other and may be implemented by, for example, an optically clear adhesive ("OCA") or an optically clear resin ("OCR").

Figure 2:
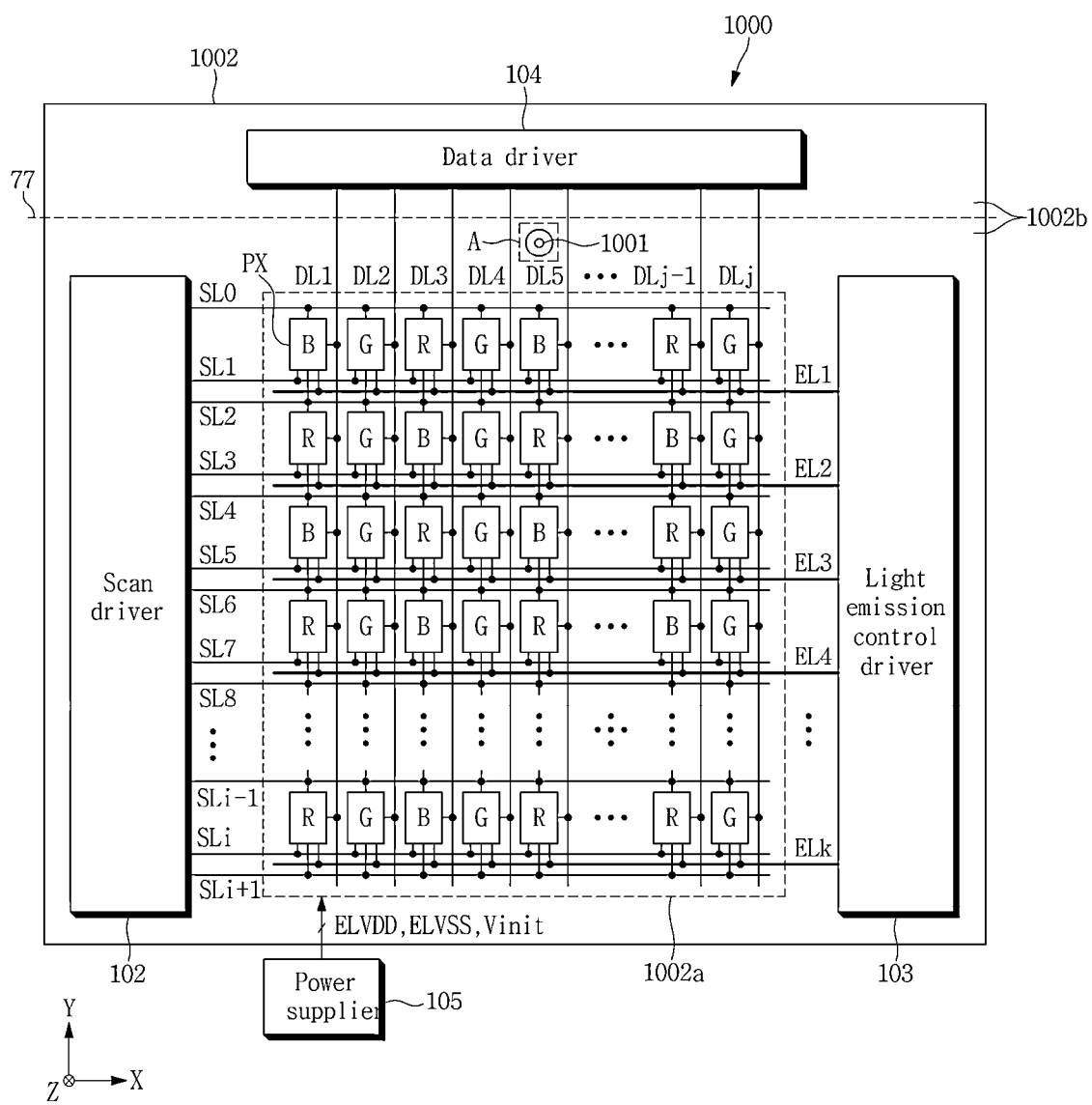
FIG. 2 is a plan view illustrating a display module according to an embodiment of the present invention.

FIG. 2 is a plan view illustrating a display module according to an embodiment of the present invention.

The display module 1000 according to an embodiment of the present invention includes a display panel 1002, a scan driver 102, an emission control driver 103, a data driver 104, and a power supplier 105.

The display panel 1002 includes a substrate; and "i+2" number of scan lines SL0 to SLi+1, "k" number of emission control lines EL1 to ELk, "j" number of data lines DL1 to DLj and "i*j" number of pixels PX disposed on the substrate, where each of i, j, and k is a natural number greater than 1. The scan driver 102, the emission control driver 103, and the data driver 104 are disposed on the display panel 1002.

The display panel 1002 includes a display area 1002a and a non-display area 1002b. The display area 1002a refers to an area including pixels that display substantial images, and the non-display area 1002b refers to an area other than the display area 1002a.

The display panel 1002 has the through-hole 1001 that is located in the non-display area 1002b and passes through the display panel 1002. The through-hole 1001 overlaps the camera module 1020 on a plane, and the inside of the through-hole 1001 is filled with the filling member 1003. A further detailed description of the through-hole 1001 passing through the display panel 1002 will be described below.

The plurality of pixels PX is disposed in the display area 1002a of the display panel 1002.

The "i+2" number of scan lines SL0 to SLi+1, the "k" number of emission control lines EL1 to ELk, and the "j" number of data lines DL1 to DLj are disposed in the display area 1002a of the display panel 1002. In such an embodiment, the "i+2" number of scan lines SL0 to SLi+1 extend to the non-display area 1002b and are connected to the scan driver 102, the "k" number of emission control lines EL1 to ELk extend to the non-display area 1002b and are connected to the emission control driver 103, and the "j" number of data lines DL1 to DLj extend to the non-display area 1002b and are connected to the data driver 104.

The scan driver 102 and the emission control driver 103 may be formed on the substrate of the display panel 1002 in a process substantially the same as a process in which the pixel PX is formed. For example, switching elements of the scan driver 102, switching elements of the emission control driver 103, and switching elements of the pixel PX may be formed on the substrate through a photolithography process.

In an embodiment, the emission control driver 103 may be embedded in the scan driver 102. For example, the scan driver 102 may further perform the function of the emission control driver 103. In such an embodiment, the scan lines SL0 to SLi+1 and the emission control lines EU to ELk are driven together by the scan driver 102.

In an embodiment, the data driver 104 may be manufactured in the form of a chip. The data driver 104 may be attached on the substrate of the display panel 1002 in a chip bonding manner. In an embodiment, the data driver 104 may be disposed on a separate printed circuit board (not illustrated) instead of on the substrate of the display panel 1002. In such an embodiment, the data lines DL1 to DLj may be connected to the data driver 104 through the printed circuit board.

In an embodiment, each of the scan driver 102 and the emission control driver 103 may be manufactured in the form of a chip. The chip-type scan driver 102 may be disposed at the non-display area 1002b of the display panel 1002 or may be disposed on a separate printed circuit board (not illustrated). The chip-type emission control driver 103 may be disposed at the non-display area 1002b of the display panel 1002 or on a separate printed circuit board (not illustrated).

As illustrated in FIG. 2, the scan lines SL0 to SLi+1 are arranged along a y-axis direction, and each of the scan lines SL0 to SLi+1 extends along an x-axis direction. The emission control lines EL1 to ELk are arranged along the y-axis direction, and each of the emission control lines EL1 to ELk extends along the x-axis direction. The data lines DL1 to DLj are arranged along the x-axis direction, and each of the data lines DL1 to DLj extends along the y-axis direction.

In an embodiment, a scan line SL0 of the scan lines SL0 to SLi+1 that is closest to the data driver 104 is defined as a first dummy scan line SL0, and a scan line SLi+1 of the scan lines SL0 to SLi+1 that is farthest from the data driver 104 is defined as a second dummy scan line SLi+1. In addition, the scan lines SL1 to SLi between the first dummy scan line SL0 and the second dummy scan line SLi+1 are respectively defined as first to i-th scan lines SL1 to SLi sequentially from a scan line that is close to the data driver 104.

The scan driver 102 generates scan signals according to a scan control signal provided from a timing controller (not illustrated) and sequentially applies the scan signals to the plurality of scan lines SL0 to SLi+1. The scan driver 102 outputs first to i-th scan signals, a first dummy scan signal, and a second dummy scan signal. The first to i-th scan signals output from the scan driver 102 are applied to the first to i-th scan lines SL1 to SLi, respectively. For example, an n-th scan signal is applied to an n-th scan line SLn, where n is a natural number greater than or equal to 1 and less than or equal to i. In addition, the first dummy scan signal output from the scan driver 102 is applied to the first dummy scan line SL0, and the second dummy scan signal output from the scan driver 102 is applied to the second dummy scan line SLi+1.

During one frame period, the scan driver 102 outputs the first to i-th scan signals sequentially from the first scan signal. In such an embodiment, the scan driver 102 outputs the first dummy scan signal prior to the first scan signal and outputs the second dummy scan signal later than the i-th scan signal. In other words, the scan driver 102 outputs the first dummy scan signal firstly during one frame period and outputs the second dummy scan signal lastly during one frame period. Accordingly, during one frame period, the entire scan lines SL0 to SLi+1 including the dummy scan lines SL0 and SLi+1 are driven sequentially from the first dummy scan line SL0.

The emission control driver 103 generates emission control signals according to a control signal provided from a timing controller (not illustrated) and sequentially applies the emission control signals to the plurality of emission control lines EL1 to ELk. The emission control driver 103 outputs first to k-th emission control signals. The first to k-th emission control signals output from the emission control driver 103 are applied to first to k-th emission control lines, respectively. For example, an m-th emission control signal is applied to an m-th emission control line ELm, where m is a natural number greater than or equal to 1 and less than or equal to k. During one frame period, the emission control driver 103 outputs the first to k-th emission control signals sequentially from the first emission control signal. Accordingly, during one frame period, the entire emission control lines EL1 to ELk are driven sequentially from the first emission control line EL1.

The data driver 104 applies first to j-th data voltages to the first to j-th data lines DL1 to DLj, respectively. For example, the data driver 104 receives image data signals and a data control signal from a timing controller (not illustrated). In addition, the data driver 104 samples the image data signals according to the data control signal, latches the sampled image data signals corresponding to one horizontal line in each horizontal period, and applies the latched image data signals to the data lines DL1 to DLj substantially simultaneously.

The pixels PX may be disposed on the display panel 1002 of the display panel 1002 in the form of a matrix. The pixels PX emit lights having different colors. For example, of the pixels PX illustrated in FIG. 2, a pixel indicated by a symbol "R" is a red pixel which emits red light, a pixel indicated by a symbol "G" is a green pixel which emits green light, and a pixel indicated by a symbol "B" is a blue pixel which emits blue light.

In an embodiment, although not illustrated, the display module may include at least one white pixel that emits white light. The white pixel may be disposed on the display area 1002a of the display panel 1002.

One pixel is connected to at least one scan line. As an example, as illustrated in FIG. 2, of a plurality of pixels PX connected to the first data line DL1, a blue pixel that is disposed closest to the data driver 104 is connected to three scan lines that receive scan signals at different output timings, e.g., the first dummy scan line SL0, the first scan line SL1, and the second scan line SL2. As another example, of a plurality of pixels PX connected to the second data line DL2, a green pixel that is disposed third farthest from the data driver 104 is connected to three scan lines that receive scan signals at different output timings, e.g., the fourth scan line SL4, the fifth scan line SL5, and the sixth scan line SL6.

Pixels that are connected in common to a same data line and located adjacent to each other are connected in common to at least one scan line. In other words, two pixels that are connected to a same data line and are adjacent to each other in the y-axis direction share at least one scan line. For example, a green pixel (herein, "a first green pixel") that is connected to the second data line DL2 and is located closest to the data driver 104 and a green pixel (herein, "a second green pixel") which is connected to the second data line DL2 and is located second farthest from the data driver 104 are located adjacent to each other, and the first green pixel and the second green pixel are connected in common to the second scan line SL2. As another example, when defining a green pixel that is connected to the second data line DL2 and located third farthest from the data driver 104 as a third green pixel, the third green pixel and the second green pixel are connected in common to the fourth scan line SL4.

Pixels that are connected in common to a same data line are independently connected to at least one different scan line. For example, the first green pixel described above is connected independently to the first scan line SL1, the second green pixel described above is connected independently to the third scan line SL3, and the third green pixel described above is connected independently to the fifth scan line SL5.

As such, each of pixels connected to a same data line is independently connected to at least one scan line. Herein, the meaning of at least two pixels (e.g., the first pixel PX1 and the second pixel PX2) being respectively connected to different scan lines is that at least one scan line connected to the first pixel PX1 is different from at least one scan line connected to the second pixel PX2. Accordingly, pixels connected to a same data line are connected to different scan lines, respectively.

On the other hand, herein, the meaning of at least two pixels (e.g., the first pixel PX1 and the second pixel PX2) being connected to a same scan line is that scan lines connected to the first pixel PX1 are completely the same as scan lines connected to the second pixel PX2. Accordingly, each of pixels connected to a same emission control line is connected to a same scan line. For example, pixels connected in common to the second emission control line EL2 are connected in common to the second scan line SL2, the third scan line SL3, and the fourth scan line SL4.

The red pixel and the blue pixel are connected to a (2p−1)-th data line, and the green pixel is connected to a 2p-th data line, where p is a natural number. For example, the red pixel and the blue pixel are connected to the first data line DL1 and the green pixel is connected to the second data line DL2.

One pixel (herein, "a first predetermined pixel") connected to a (2p−1)-th data line (e.g., the first data line DL1) and another pixel (herein, "a second predetermined pixel") connected to another (2p−1)-th data line (e.g., the third data line DL3) may be connected to a same scan line, and, in such an embodiment, the first predetermined pixel emits a light having a color different from a color of a light emitted from the second predetermined pixel. For example, the first predetermined pixel is a blue pixel connected to the first dummy scan line SL0, the first scan line SL1, the second scan line SL2, and the first data line DL1, and the second predetermined pixel may be a red pixel connected to the first dummy scan line SL0, the first scan line SL1, the second scan line SL2, and the third data line DL3.

Two adjacent pixels connected to a same data line (e.g., the (2p−1)-th data line) and emitting lights having different colors from each other and at least one green pixel adjacent to one of the two pixels is included in a unit pixel for displaying a unit image. For example, a red pixel connected to the third data line DL3 and the first scan line SL1, a blue pixel connected to the third data line DL3 and the third scan line SL3, a green pixel connected to the second data line DL2 and the first scan line SL1, and a green pixel connected to the fourth data line DL4 and the first scan line SL1 may form one unit pixel.

Each pixel PX commonly receives a high potential driving voltage ELVDD, a low potential driving voltage ELVSS, and an initializing voltage Vinit from the power supplier 105. In other words, one pixel receives all of the high potential driving voltage ELVDD, the low potential driving voltage ELVSS, and the initializing voltage Vinit.

In an embodiment, the display module 1000 is bent with respect to a bending portion 77. In an embodiment, for example, a portion of the display module in which the data driver 104 is disposed is bent with respect to the bending portion 77 while rotating toward a back surface of the display module 1000.

Figure 3:
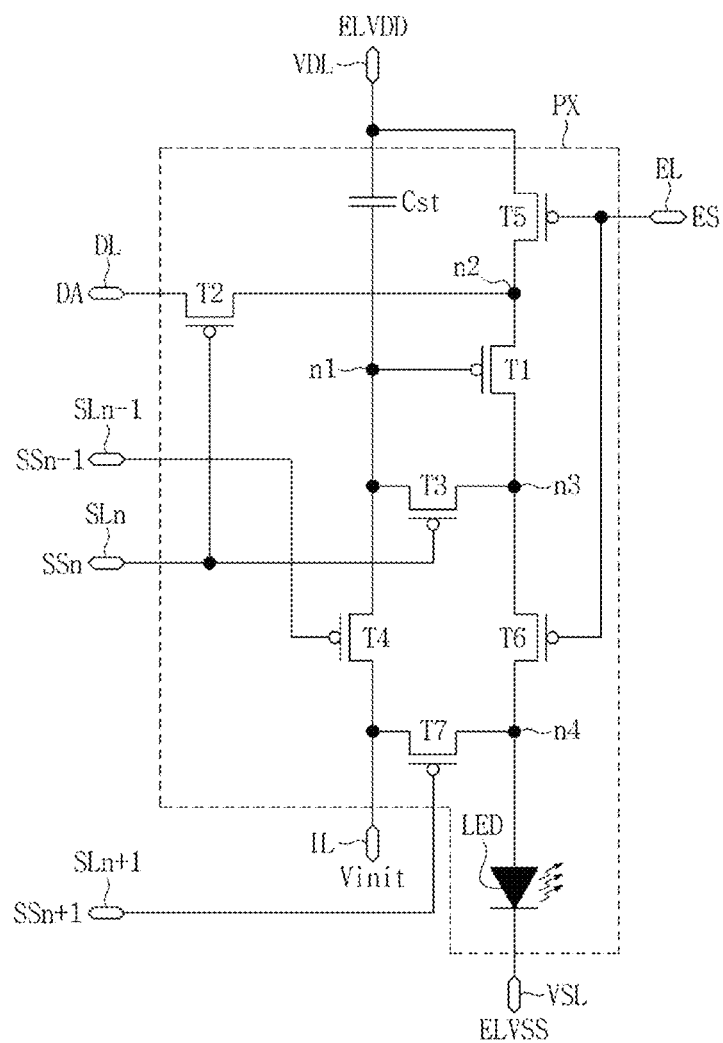
FIG. 3 is an equivalent circuit diagram illustrating one of pixels illustrated in FIG. 2.

FIG. 3 is an equivalent circuit diagram illustrating one of pixels illustrated in FIG. 2.

In an embodiment, a pixel may include a first switching element T1, a second switching element T2, a third switching element T3, a fourth switching element T4, a fifth switching element T5, a sixth switching element T6, a seventh switching element T7, a storage capacitor Cst, and a light emitting element (herein, denoted as a light emitting diode ("LED")).

In an embodiment, each of the first, second, third, fourth, fifth, sixth, and seventh switching elements T1, T2, T3, T4, T5, T6, and T7 may be a P-type transistor, as illustrated in FIG. 3. However, embodiments are not limited thereto, and in an embodiment, each of the first, second, third, fourth, fifth, sixth, and seventh switching elements T1, T2, T3, T4, T5, T6, and T7 may be an N-type transistor.

The first switching element T1 includes a gate electrode connected to a first node n1 and is connected between a second node n2 and a third node n3. One of a source electrode and a drain electrode of the first switching element T1 is connected to the second node n2 and the other of the source electrode and the drain electrode of the first switching element T1 is connected to the third node n3.

The second switching element T2 includes a gate electrode connected to the n-th scan line SLn and is connected between the data line DL and the second node n2. One of a source electrode and a drain electrode of the second switching element T2 is connected to the data line DL, and the other of the source electrode and the drain electrode of the second switching element T2 is connected to the second node n2. An n-th scan signal SSn is applied to the n-th scan line SLn.

The third switching element T3 includes a gate electrode connected to the n-th scan line SLn and is connected between the first node n1 and the third node n3. One of a source electrode and a drain electrode of the third switching element T3 is connected to the first node n1, and the other of the source electrode and the drain electrode of the third switching element T3 is connected to the third node n3.

The fourth switching element T4 includes a gate electrode connected to an (n−1)-th scan line SLn−1 and is connected between the first node n1 and an initialization line IL. One of a source electrode and a drain electrode of the fourth switching element T4 is connected to the first node n1, and the other of the source electrode and the drain electrode of the fourth switching element T4 is connected to the initialization line IL. The aforementioned initializing voltage Vinit is applied to the initialization line IL, and an (n−1)-th scan signal SLn−1 is applied to the (n−1)-th scan line SLn−1.

The fifth switching element T5 includes a gate electrode connected to the emission control line EL and is connected between the second node n2 and a high potential line VDL, which is one of power supply lines. One of a source electrode and a drain electrode of the fifth switching element T5 is connected to the high potential line VDL, and the other of the source electrode and the drain electrode of the fifth switching element T5 is connected to the second node n2. The above-described high potential driving voltage ELVDD is applied to the high potential line VDL.

The sixth switching element T6 includes a gate electrode connected to the emission control line EL and is connected between the third node n3 and a fourth node n4. One of a source electrode and a drain electrode of the sixth switching element T6 is connected to the third node n3, and the other of the source electrode and the drain electrode of the sixth switching element T6 is connected to the fourth node n4. An emission control signal ES is applied to the emission control line EL.

The seventh switching element T7 includes a gate electrode connected to an (n+1)-th scan line SLn+1 and is connected between the initialization line IL and the fourth node n4. One of a source electrode and a drain electrode of the seventh switching element T7 is connected to the initialization line IL, and the other of the source electrode and the drain electrode of the seventh switching element T7 is connected to the fourth node n4. An (n+1)-th scan signal SSn+1 is applied to the (n+1)-th scan line SLn+1.

The storage capacitor Cst is connected between the high potential line VDL and the first node n1. The storage capacitor Cst stores a signal applied to the gate electrode of the first switching element T1 for one frame period.

The LED emits light in accordance with a driving current applied through the first switching element T1. The LED emits light having different brightness depending on a magnitude of the driving current. An anode electrode of the LED is connected to the fourth node n4, and a cathode electrode of the LED is connected to a low potential line VSL which is another of the power supply lines. The aforementioned low potential driving voltage ELVSS is applied to this low potential line VSL. The LED may be an organic light emitting diode ("OLED"). The anode electrode of the LED corresponds to a pixel electrode to be described below, and the cathode electrode of the LED corresponds to a common electrode to be described below.

The fourth switching element T4 is turned on when the (n−1)-th scan signal SSn−1 is applied to the (n−1)-th scan line SLn−1. The initializing voltage Vinit is applied to the first node n1 (i.e., the gate electrode of the first switching element T1) through the turned-on fourth switching element T4. Accordingly, the voltage of the gate electrode of the first switching element T1 is initialized.

The second switching element T2 and the third switching element T3 are turned on when the n-th scan signal SSn is applied to the n-th scan line SLn. A data voltage DA is applied to the first node n1 (i.e., the gate electrode of the first switching element T1) through the turned-on second switching element T2, and, accordingly, the first switching element T1 is turned on. Accordingly, a threshold voltage of the first switching element T1 is detected, and the threshold voltage is stored in the storage capacitor Cst.

The fifth switching element T5 and the sixth switching element T6 are turned on when the emission control signal ES is applied to the emission control line EL. A driving current is applied to the LED through the turned-on fifth switching element T5, the turned-on first switching element T1, and the turned-on sixth switching element T6 such that the LED emits light.

The seventh switching element T7 is turned on when the (n+1)-th scan signal SSn+1 is applied to the (n+1)-th scan line SLn+1. The initializing voltage is applied to the fourth node n4 (i.e., the anode electrode of the LED) through the turned-on seventh switching element T7. Accordingly, the LED is biased in a reverse direction such that the LED is turned off.

Figure 4:
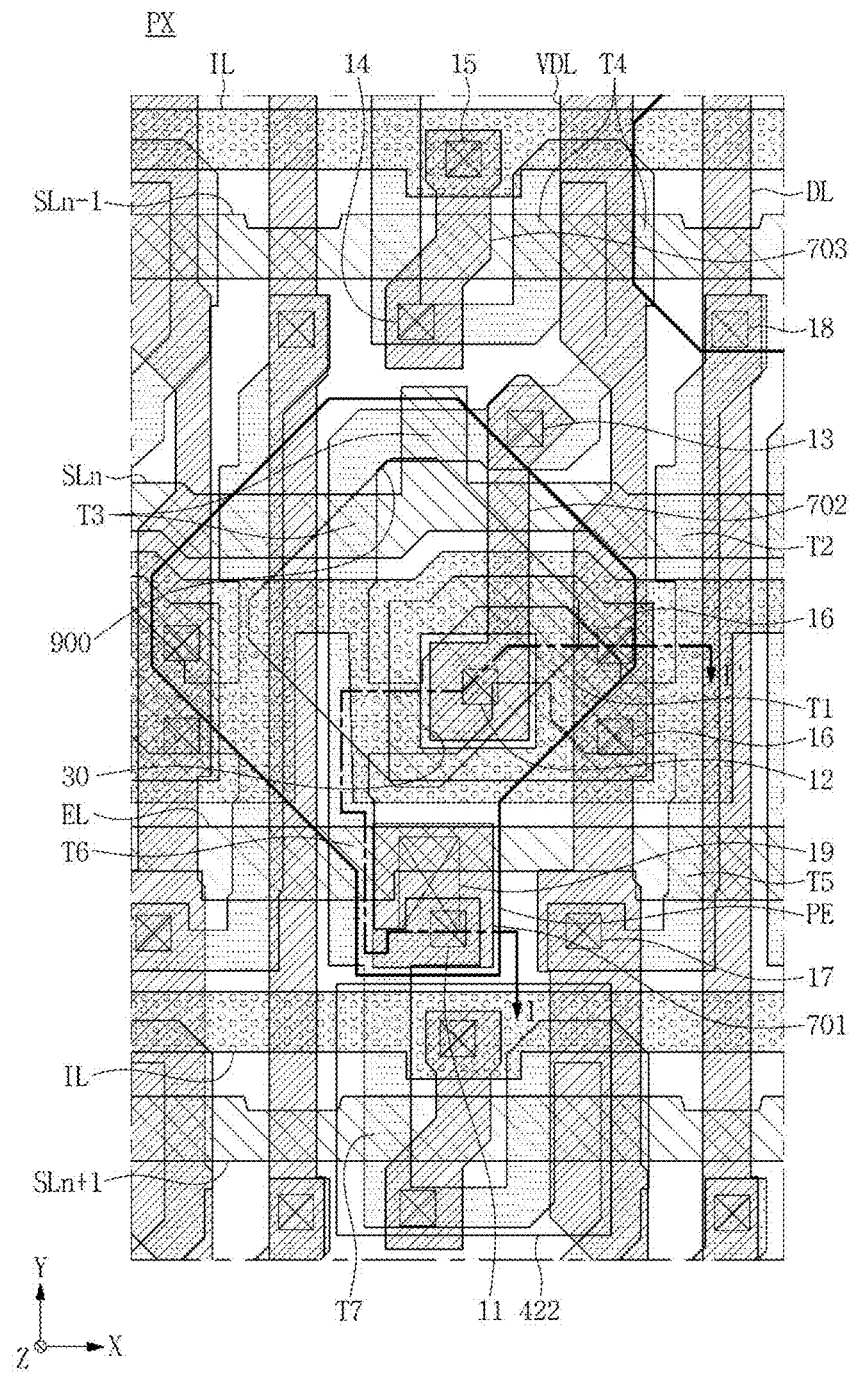
FIG. 4 is a plan view illustrating a display device including one of the pixels illustrated in FIG. 2 and lines connected thereto.

FIG. 4 is a plan view illustrating a display device including one of the pixels illustrated in FIG. 2 and lines connected thereto; FIGS. 5A to 5G are views separately illustrating some of components shown in FIG. 4; and FIG. 6 is a cross-sectional view taken along the line I-I' of FIG. 4.

Figure 5A:
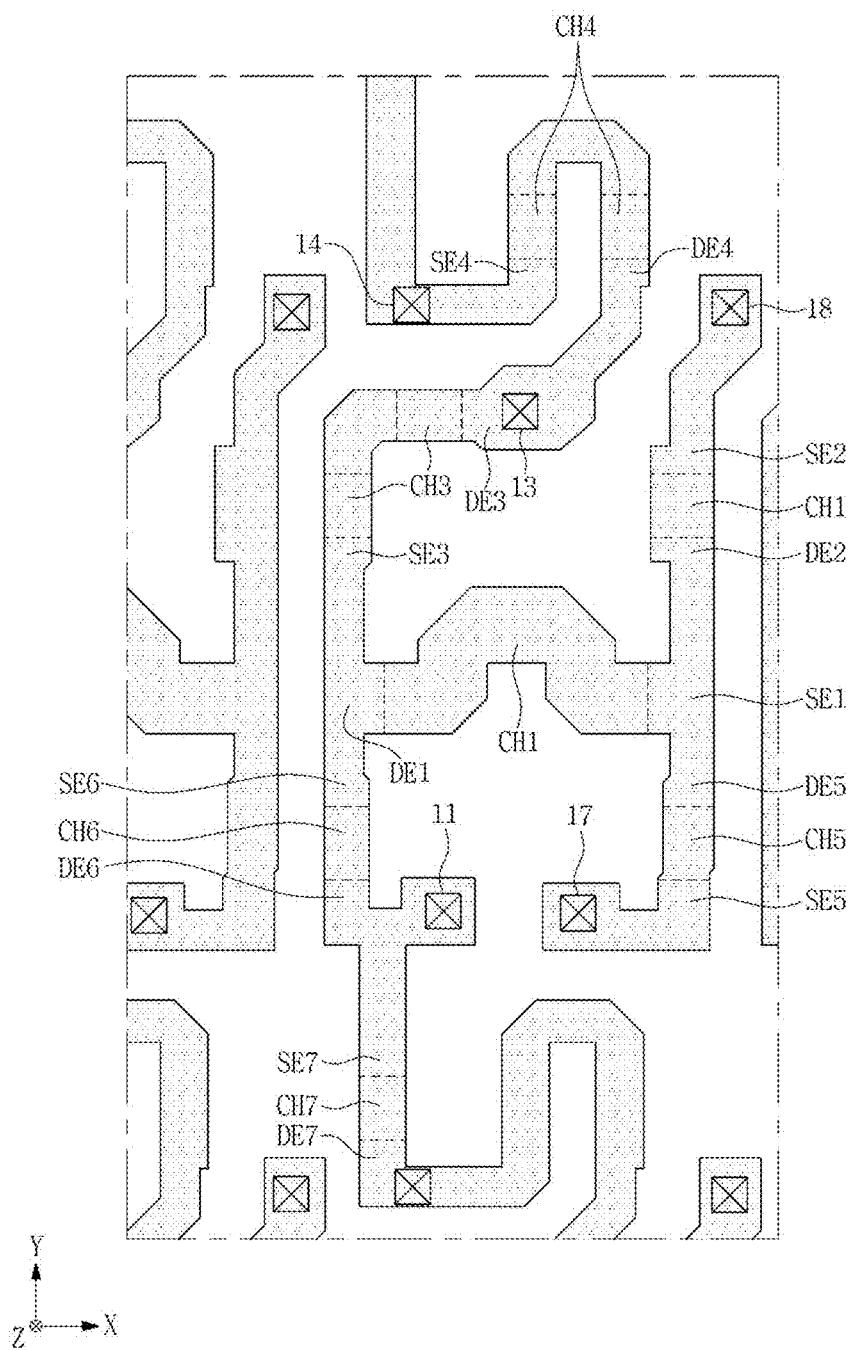
FIGS. 5A to 5G are views separately illustrating some of components shown in FIG. 4.
Figure 5B:
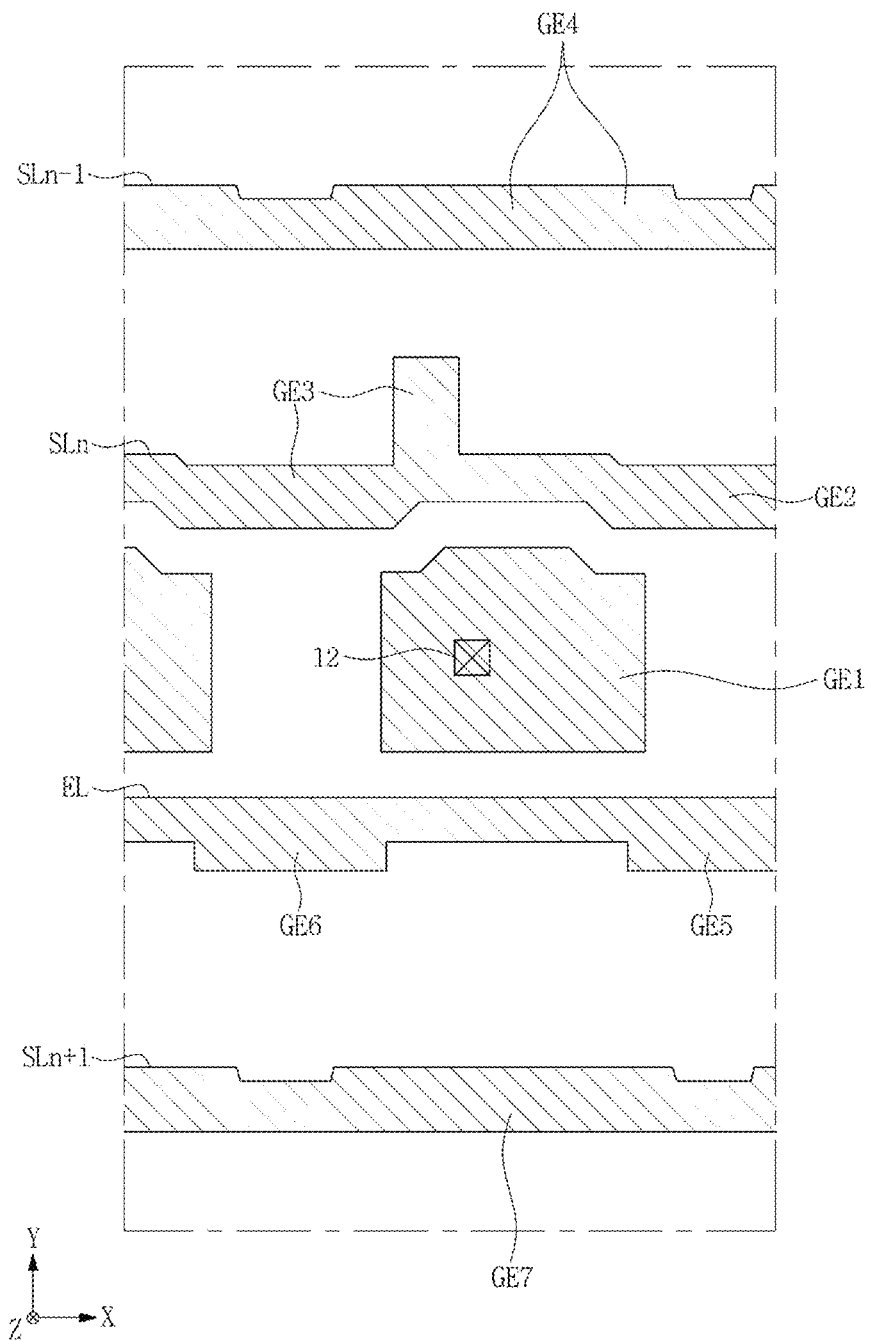
Figure 5C:
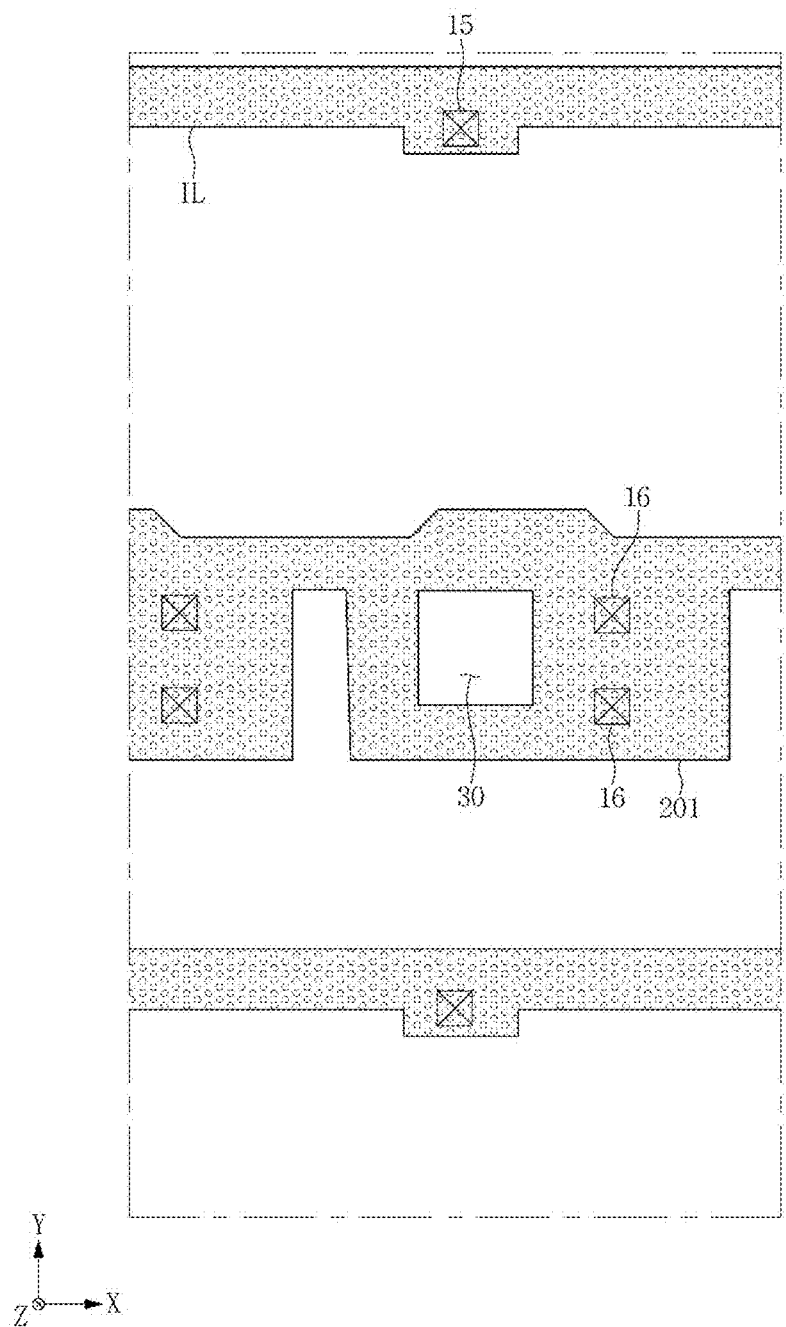
Figure 5D:
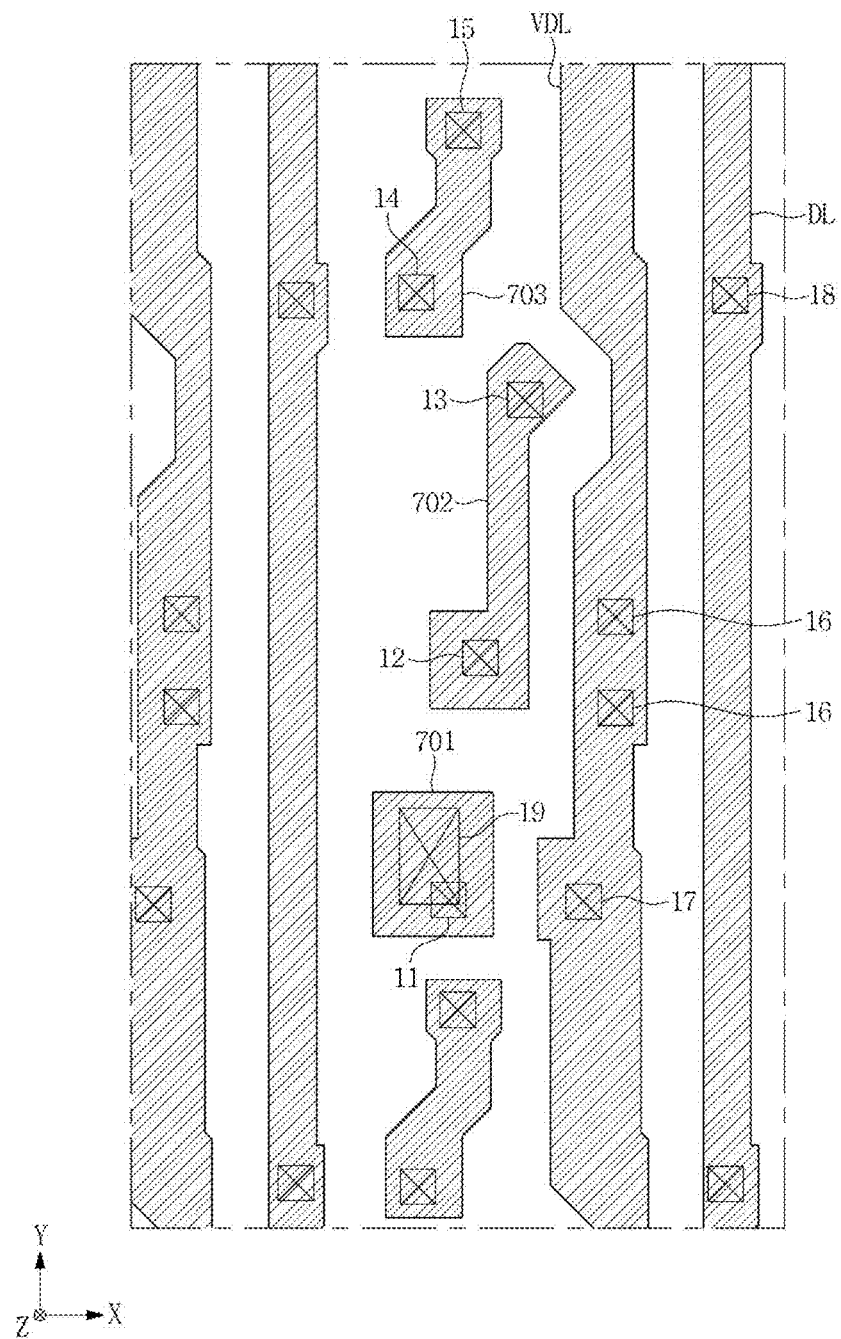
Figure 5E:
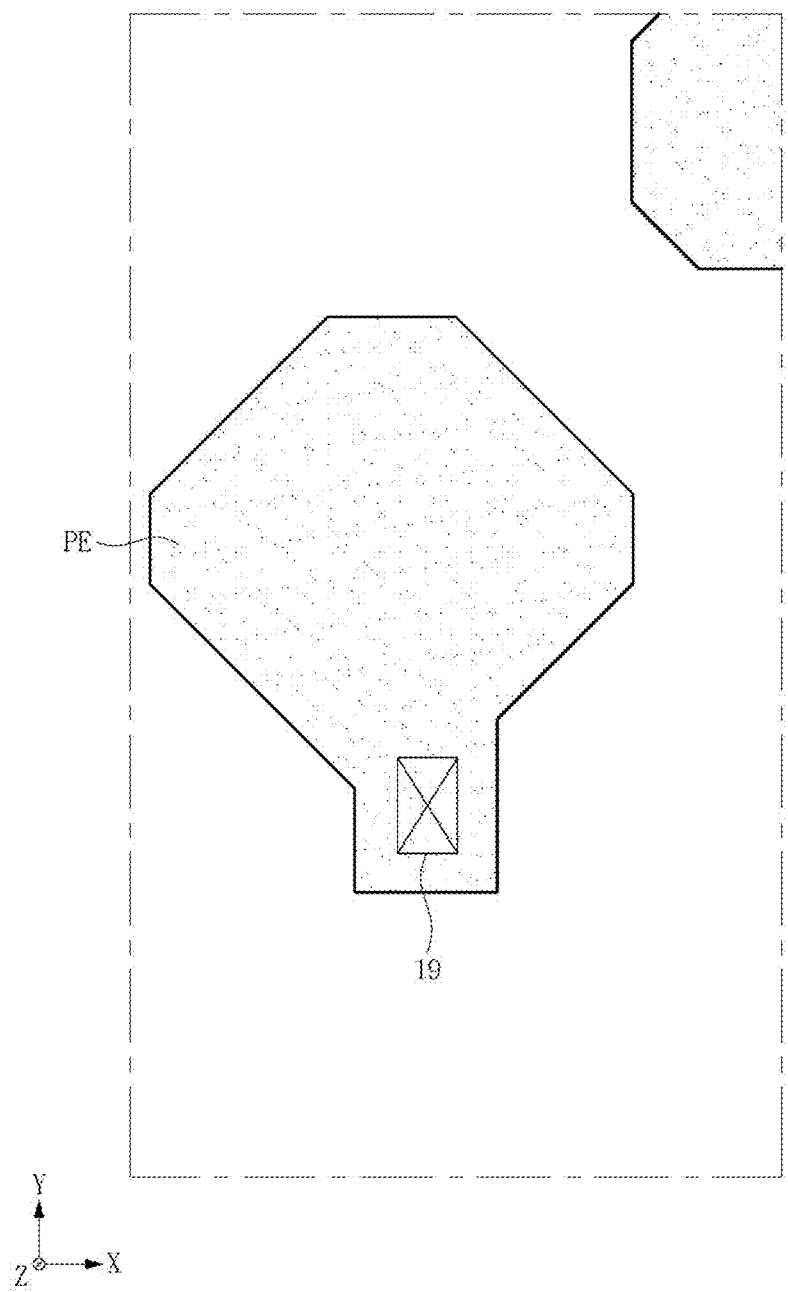
Figure 5F:
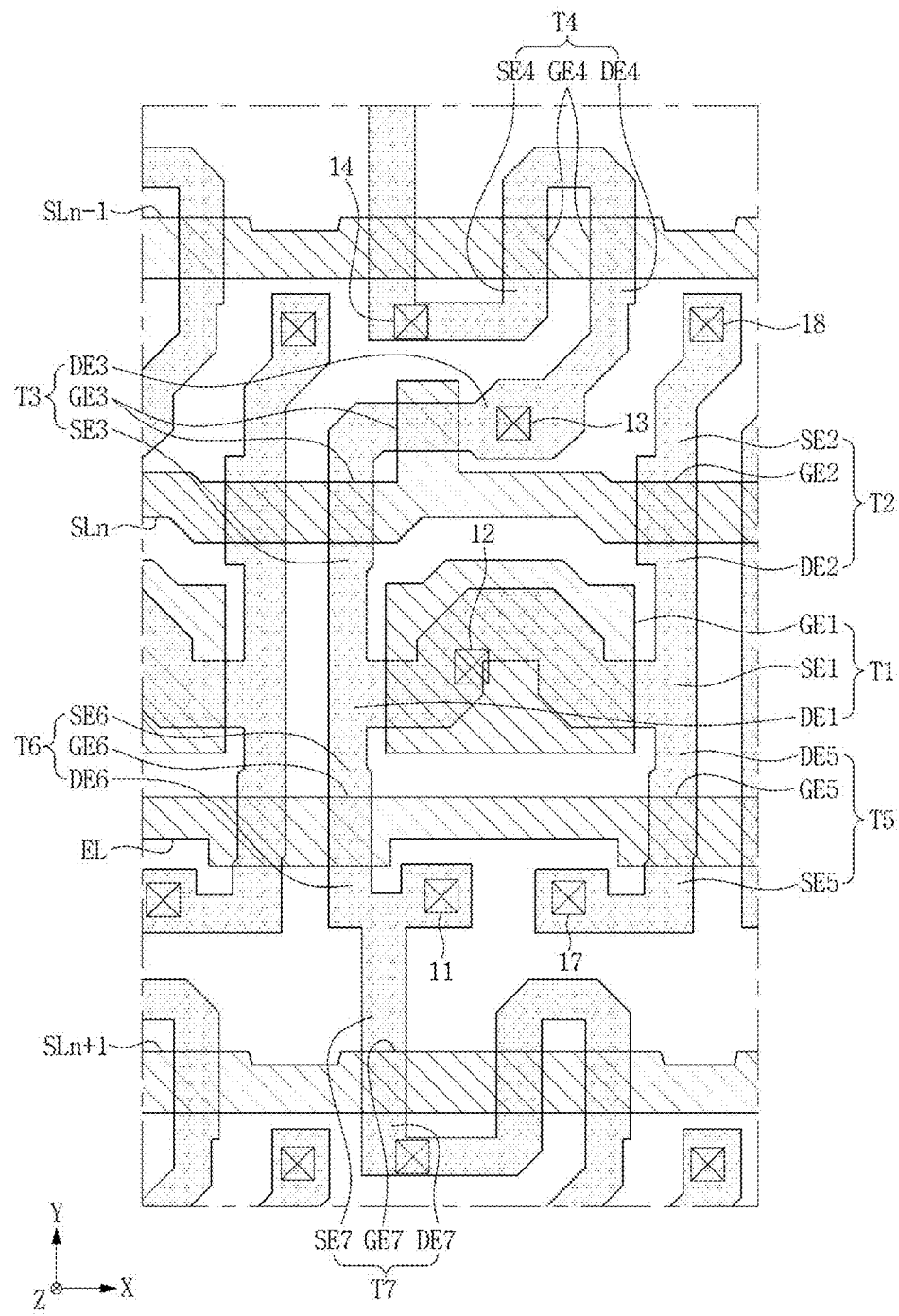
Figure 5G:
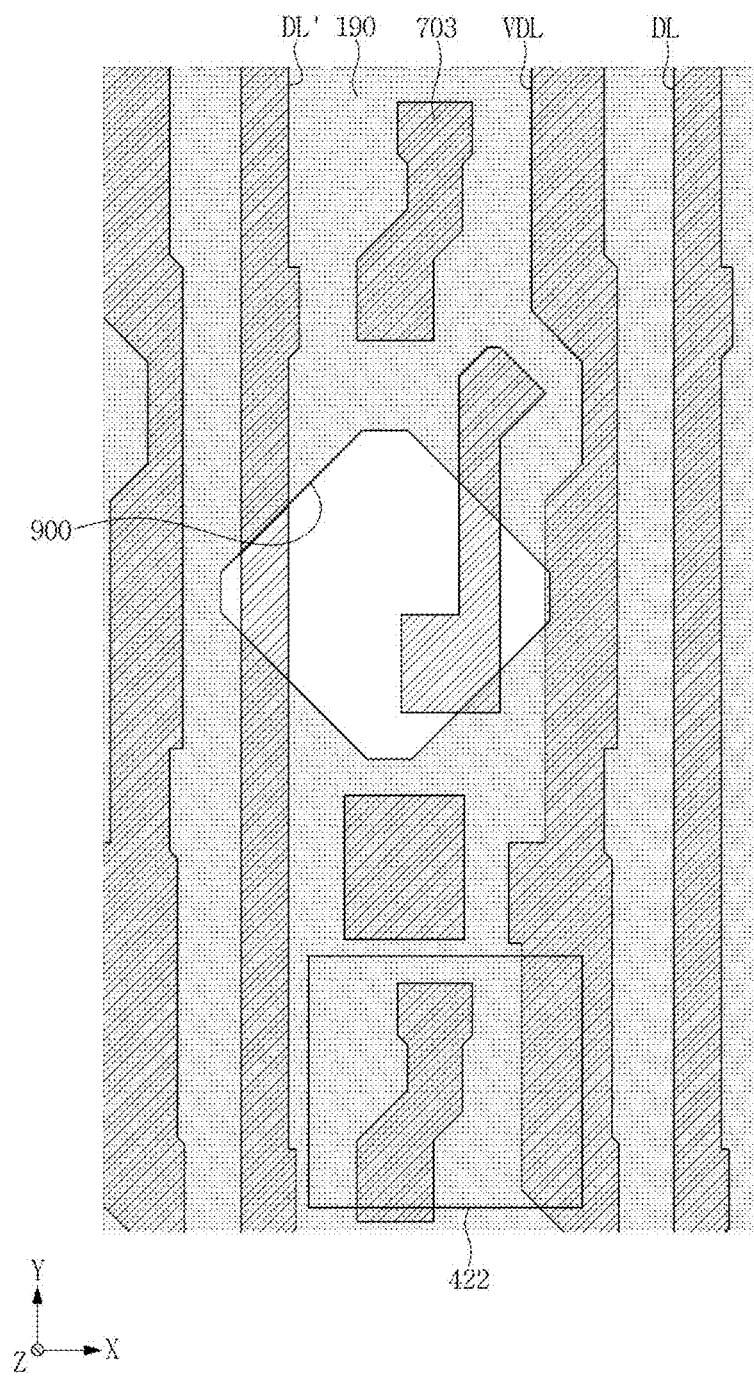

For example, FIG. 5A is a view illustrating a semiconductor layer 321 of FIG. 4; FIG. 5B is a view illustrating the (n−1)-th scan line SLn−1, the n-th scan line SLn, the (n+1)-th scan line SLn+1 and the emission control line EL of FIG. 4; FIG. 5C is a view illustrating the initialization line IL and a capacitor electrode 201 of FIG. 4; FIG. 5D shows the data line DL and the high potential line VDL of FIG. 4; FIG. 5E is a view illustrating the pixel electrode PE of FIG. 4; FIG. 5F is a view illustrating the semiconductor layer 321, the (n−1)-th scan line SLn−1, the n-th scan line SLn, the (n+1)-th scan line SLn+1 and the emission control line EL of FIG. 4; and FIG. 5G is a view illustrating a first connection electrode 701, a second connection electrode 702, a third connection electrode 703, the data line DL, the high potential line VDL, and a light blocking layer 190 of FIG. 4.

Figure 6:
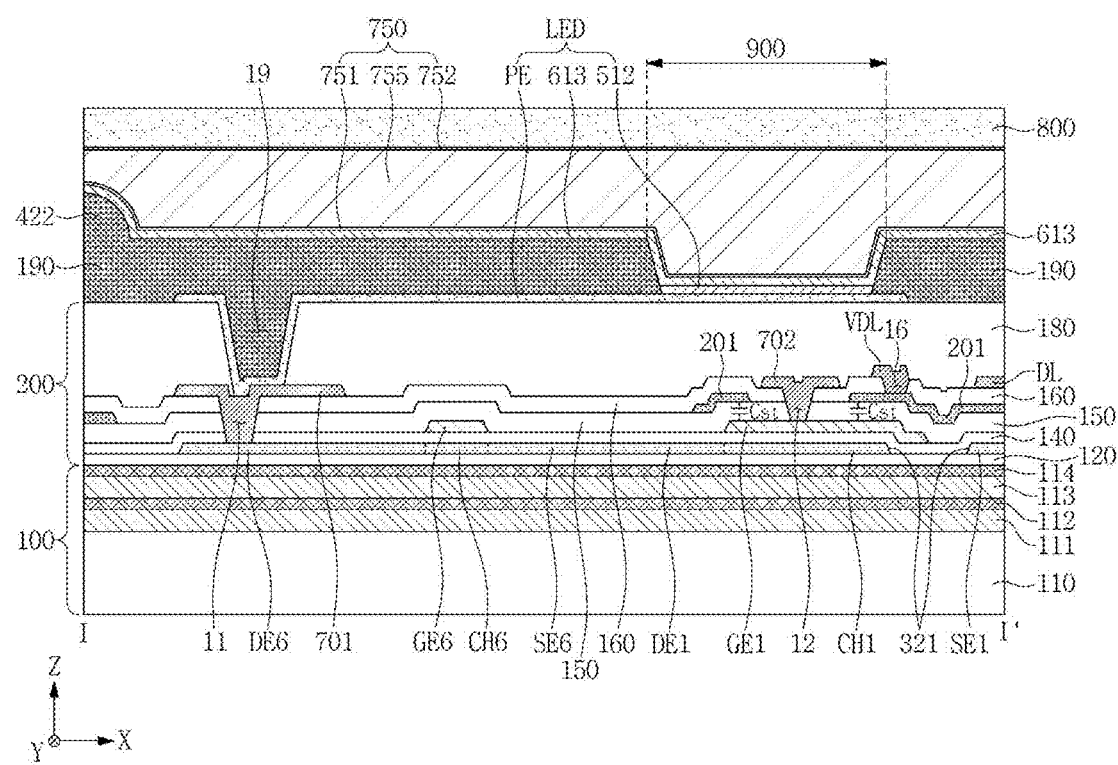
FIG. 6 is a cross-sectional view taken along the line I-I' of FIG. 4.

As illustrated in FIGS. 4 and 6, the display panel 1002 according to an embodiment of the present invention includes a substrate 100, a pixel circuit unit 200, a light blocking layer 190, a spacer 422, an LED, a sealing unit 750, and a polarizing plate 800.

As illustrated in FIGS. 4 and 5F, the first switching element T1 of the pixel circuit unit 200 includes a firstgate electrode GE1, a first source electrode SE1, and a first drain electrode DE1.

The second switching element T2 of the pixel circuit unit 200 includes a second gate electrode GE2, a second source electrode SE2, and a second drain electrode DE2.

The third switching element T3 of the pixel circuit unit 200 includes a third gate electrode GE3, a third source electrode SE3, and a third drain electrode DE3.

The fourth switching element T4 of the pixel circuit unit 200 includes a fourth gate electrode GE4, a fourth source electrode SE4, and a fourth drain electrode DE4.

The fifth switching element T5 of the pixel circuit unit 200 includes a fifth gate electrode GE5, a fifth source electrode SE5, and a fifth drain electrode DE5.

The sixth switching element T6 of the pixel circuit unit 200 includes a sixth gate electrode GE6, a sixth source electrode SE6, and a sixth drain electrode DE6.

The seventh switching element T7 of the pixel circuit unit 200 includes a seventh gate electrode GE7, a seventh source electrode SE7, and a seventh drain electrode DE7.

In an embodiment, the substrate 100 illustrated in FIG. 6 may include at least two layers. In an embodiment, for example, the substrate 100 may include a base layer 110, a first layer 111, a second layer 112, a third layer 113, and a fourth layer 114 arranged along a Z-axis direction. The first layer 111 is disposed between the base layer 110 and the second layer 112, the second layer 112 is disposed between the first layer 111 and the third layer 113, the third layer 113 is disposed between the second layer 112 and the fourth layer 114, and the fourth layer 114 is disposed between the third layer 113 and a buffer layer 120 of the pixel circuit unit 200.

In an embodiment, the first layer 111 may have a thickness larger than a thickness of the second layer 112. The thickness means the size measured in the Z-axis direction.

The third layer 113 may have a thickness larger than a thickness of the fourth layer 114.

The first layer 111 and the third layer 113 may have a substantially equal thickness.

The second layer 112 and the fourth layer 114 may have a substantially equal thickness.

In an embodiment, the base layer 110 may be a glass substrate or a film.

In an embodiment, the first layer 111 may include glass, transparent plastic, or the like. In an embodiment, the first layer 111 may include an organic material. For example, the first layer 111 may include one selected from the group consisting of: kapton, polyether sulfone (PES), polycarbonate (PC), polyimide (PI), polyethylene terephthalate (PET), polyethylene naphthalate (PEN), polyacrylate (PAR), fiber reinforced plastic (FRP), or the like.

In an embodiment, the second layer 112 may include an inorganic material. For example, the second layer 112 may include one of a silicon nitride ($SiN_x$) layer, a silicon oxide ($SiO_2$) layer, and a silicon oxynitride ($SiO_xN_y$) layer.

The third layer 113 may include a material substantially the same as a material included in the first layer 111 described above.

The fourth layer 114 may include a material substantially the same as a material included in the second layer 112 described above.

As illustrated in FIG. 6, the pixel circuit unit 200 is disposed on the substrate 100. For example, the pixel circuit unit 200 is disposed on the fourth layer 114 of the substrate 100.

The pixel circuit unit 200 may include the buffer layer 120, the semiconductor layer 321, a first gate insulating layer 140, the first gate electrode GE1, the second gate electrode GE2, the third gate electrode GE3, the fourth gate electrode GE4, the fifth gate electrode GE5, the sixth gate electrode GE6, the seventh gate electrode GE7, the (N−1)-th scan line SLn−1, the n-th scan line SLn, the (N+1)-th scan line SLn+1, the emission control line EL, a second gate insulating layer 150, the initialization line IL, the capacitor electrode 201, an insulating interlayer 160, the first connection electrode 701, the second connection electrode 702, the third connection electrode 703, the data line DL, the high potential line VDL, and a planarization layer 180.

The buffer layer 120 is disposed on the fourth layer 114 of the substrate 100. In an embodiment, the buffer layer 120 may be disposed over the entire surface of the fourth layer 114. For example, the buffer layer 120 may overlap the entire surface of the fourth layer 114.

The buffer layer 120 serves to substantially prevent permeation of undesirable elements and to planarize a surface therebelow, and may include any of suitable materials for planarizing and/or substantially preventing permeation. In an embodiment, for example, the buffer layer 120 may include one of the following: a silicon nitride ($SiN_x$) layer, a silicon oxide ($SiO_2$) layer, and a silicon oxynitride ($Si_xN_y$) layer. However, the buffer layer 120 is not invariably necessary and may be omitted based on the kind of the substrate 100 and process conditions of the substrate 100.

As illustrated in FIG. 6, the semiconductor layer 321 is disposed on the buffer layer 120.

As illustrated in FIG. 5A, the semiconductor layer 321 provides respective channel areas CH1, CH2, CH3, CH4, CH5, CH6, and CH7 of the first, second, third, fourth, fifth, sixth, and seventh switching elements T1, T2, T3, T4, T5, T6, and T7. In addition, the semiconductor layer 321 provides the respective source electrodes SE1, SE2, SE3, SE4, SE5, SE6, and SE7 and the respective drain electrodes DE1, DE2, DE3, DE4, DE5, DE6, and DE7 of the first, second, third, fourth, fifth, sixth, and seventh switching elements T1, T2, T3, T4, T5, T6, and T7.

To this end, the semiconductor layer 321 may include the first channel area CH1, the second channel area CH2, the third channel area CH3, the fourth channel area CH4, the fifth channel area CH5, the sixth channel area CH6, the seventh channel area CH7, the first source electrode SE1, the second source electrode SE2, the third source electrode SE3, the fourth source electrode SE4, the fifth source electrode SE5, the sixth source electrode SE6, the seventh source electrode SE7, the first drain electrode DE1, the second drain electrode DE2, the third drain electrode DE3, the fourth drain electrode DE4, the fifth drain electrode DE5, the sixth drain electrode DE6, and the seventh drain electrode DE7.

The first source electrode SE1, the second drain electrode DE2, and the fifth drain electrode DE5 are connected to each other. In an embodiment, for example, the first source electrode SE1, the second drain electrode DE2, and the fifth drain electrode DE5 may be formed unitarily.

The first drain electrode DE1, the third source electrode SE3, and the sixth source electrode SE6 are connected to each other. For example, the first drain electrode DE1, the third source electrode SE3, and the sixth source electrode SE6 may be formed unitarily.

The third drain electrode DE3 and the fourth drain electrode DE4 are connected to each other. For example, the third drain electrode DE3 and the fourth drain electrode DE4 may be formed unitarily.

The sixth drain electrode DE6 and the seventh source electrode SE7 are connected to each other. For example, the sixth drain electrode DE6 and the seventh source electrode SE7 may be formed unitarily.

In an embodiment, the semiconductor layer 321 may include any of a polycrystalline silicon layer, an amorphous silicon layer, and an oxide semiconductor such as indium-gallium-zinc oxide (IGZO) or indium zinc tin oxide (IZTO). For example, in the case in which the semiconductor layer 321 includes a polycrystalline silicon layer, the semiconductor layer 321 may include a channel area which is not doped with an impurity, and a source electrode and a drain electrode, on the opposite sides of the channel area, which are doped with impurities.

As illustrated in FIG. 6, the first gate insulating layer 140 is disposed on the semiconductor layer 321 and the buffer layer 120. In an embodiment, the first gate insulating layer 140 may include at least one of: tetraethyl orthosilicate (TEOS), silicon nitride ($SiN_x$) and silicon oxide ($SiO_2$). In an embodiment, for example, the first gate insulating layer 140 may have a double-layer structure in which a $SiN_x$ layer having a thickness of about 40 nm and a TEOS layer having a thickness of about 80 nm are sequentially stacked.

As illustrated in FIG. 6, the first gate electrode GE1 is disposed on the first gate insulating layer 140. For example, the first gate electrode GE1 is disposed between the first gate insulating layer 140 and the second gate insulating layer 150.

Although not illustrated in FIG. 6, the second gate electrode GE2, the third gate electrode GE3, the fourth gate electrode GE4, the fifth gate electrode GE5, the sixth gate electrode GE6, and the seventh gate electrode GE 7 are also disposed on the first gate insulating layer 140. For example, the second, third, fourth, fifth, sixth, and seventh gate electrodes GE2, GE3, GE4, GE5, GE6, and GE7 are disposed between the firstgate insulating layer 140 and the second gate insulating layer 150.

Although not illustrated in FIG. 6, the scan line and the emission control line are also disposed on the first gate insulating layer 140. For example, the (n−1)-th scan line SLn−1, the n-th scan line SLn, the (n+1)-th scan line SLn+1, and the emission control line EL are disposed between the first gate insulating layer 140 and the second gate insulating layer 150.

As illustrated in FIGS. 4 and 5F, the first gate electrode GE1 overlaps the first channel area CH1 of the semiconductor layer 321, the second gate electrode GE2 overlaps the second channel area CH2 of the semiconductor layer 321, the third gate electrode GE3 overlaps the third channel area CH3 of the semiconductor layer 321, the fourth gate electrode GE4 overlaps the fourth channel area CH4 of the semiconductor layer 321, the fifth gate electrode GE5 overlaps the fifth channel area CH5 of the semiconductor layer 321, the sixth gate electrode GE6 overlaps the sixth channel area CH6 of the semiconductor layer 321, and the seventh gate electrode GE7 overlaps the seventh channel area CH7 of the semiconductor layer 321.

As illustrated in FIGS. 5B and 5F, the fourth gate electrode GE4 is connected to the (n−1)-th scan line SLn−1, and, in such an embodiment, the fourth gate electrode GE4 may be a portion of the (n−1)-th scan line SLn−1. For example, a portion of the (n−1)-th scan line SLn−1 that overlaps the semiconductor layer 321 may correspond to the fourth gate electrode GE4.

As illustrated in FIGS. 5B and 5F, the third gate electrode GE3 is connected to the n-th scan line SLn, and, in such an embodiment, the third gate electrode GE3 may be a portion of the n-th scan line SLn. For example, a portion of the n-th scan line SLn that overlaps the semiconductor layer 321 may correspond to the third gate electrode GE3.

As illustrated in FIGS. 5B and 5F, the seventh gate electrode GE7 is connected to the (n+1)-th scan line SLn+1, and, in such an embodiment, the seventh gate electrode GE7 may be a portion of the (n+1)-th scan line SLn+1. For example, a portion of the (n+1)-th scan line SLn+1 that overlaps the semiconductor layer 321 may correspond to the seventh gate electrode GE7.

As illustrated in FIGS. 5B and 5F, the fifth gate electrode GE5 and the sixth gate electrode GE6 are connected in common to one emission control line EL, and, in such an embodiment, the fifth gate electrode GE5 and the sixth gate electrode GE6 may be portions of the emission control line EL. For example, two portions of the emission control line EL overlapping the semiconductor layer 321 may correspond to the fifth gate electrode GE5 and the sixth gate electrode GE6, respectively.

The scan line (e.g., at least one of the (n−1)-th scan line SLn−1, the n-th scan line SLn, and the (n+1)-th scan line SLn+1) may include any of: aluminum (Al) or alloys thereof, silver (Ag) or alloys thereof, copper (Cu) or alloys thereof, or molybdenum (Mo) or alloys thereof. Alternatively, the scan line may include any of chromium (Cr), tantalum (Ta), and/or titanium (Ti). In an embodiment, the scan line may have a multilayer structure including at least two conductive layers that have different physical properties.

In an embodiment, the first, second, third, fourth, fifth, sixth, and seventh gate electrodes GE1, GE2, GE3, GE4, GE5, GE6, and GE7 may include a substantially same material and have a substantially same structure (e.g., a multilayer structure) as those of the scan line described above. In an embodiment, each of the gate electrodes GE1, GE2, GE3, GE4, GE5, GE6, and GE7 and the scan line may be substantially simultaneously formed in a substantially same process.

In an embodiment, the emission control line EL may include a substantially same material and have a substantially same structure (e.g., a multilayer structure) as those of the above-described scan line. In an embodiment, the emission control line EL and the scan line may be substantially simultaneously formed in a substantially same process.

As illustrated in FIG. 6, the second gate insulating layer 150 is disposed on the first gate electrode GE1 and the first gate insulating layer 140. In an embodiment, the second gate insulating layer 150 may have a thickness larger than a thickness of the first gate insulating layer 140. In an embodiment, the second gate insulating layer 150 may include a material substantially the same as a material included in the first gate insulating layer 140 described above.

Although not illustrated in FIG. 6, the second gate insulating layer 150 is also disposed on the second, third, fourth, fifth, sixth, and seventh gate electrodes GE2, GE3, GE4, GE5, GE6, and GE7, each scan line (e.g., scan lines SLn−1, SLn, SLn+1), and the emission control line EL.

As illustrated in FIG. 6, the capacitor electrode 201 is disposed on the second gate insulating layer 150. For example, the capacitor electrode 201 is disposed between the second gate insulating layer 150 and the insulating interlayer 160. The capacitor electrode 201 forms the storage capacitor Cst together with the first gate electrode GE1 described above. For example, the first gate electrode GE1 corresponds to a first electrode of the storage capacitor Cst, and the capacitor electrode 201 corresponds to a second electrode of the storage capacitor Cst. For example, a portion of the first gate electrode GE1 overlapping the capacitor electrode 201 corresponds to the first electrode of the storage capacitor Cst, and a portion of the capacitor electrode 201 overlapping the first gate electrode GE1 corresponds to the second electrode of the storage capacitor Cst.

Although not illustrated in FIG. 6, the initialization line IL (see FIGS. 4 and 5C) is also disposed on the second gate insulating layer 150. For example, the initialization line IL is disposed between the second gate insulating layer 150 and the insulating interlayer 160.

As illustrated in FIGS. 4 and 5C, the capacitor electrode 201 has a hole 30. In an embodiment, the hole 30 may have a quadrangular shape. However, the shape of the hole is not limited to the quadrangle. For example, the hole 30 may have any of various shapes, such as circular and triangular shapes.

As illustrated in FIGS. 4 and 5C, the capacitor electrodes 201 of pixels that are adjacent to each other may be connected to each other. In other words, the capacitor electrodes 201 of the pixels that are adjacent to each other in the x-axis direction may be formed unitarily.

As illustrated in FIG. 6, the insulating interlayer 160 is disposed on the capacitor electrode 201, the initialization line IL, and the second gate insulating layer 150. In an embodiment, the insulating interlayer 160 may have a thickness larger than a thickness of the first gate insulating layer 140. In an embodiment, the insulating interlayer 160 may include a material substantially the same as a material included in the first gate insulating layer 140 described above.

As illustrated in FIG. 6, the first connection electrode 701, the second connection electrode 702, the high potential line VDL, and the data line DL are disposed on the insulating interlayer 160. For example, the first connection electrode 701, the second connection electrode 702, the high potential line VDL, and the data line DL are disposed between the insulating interlayer 160 and the planarization layer 180.

Although not illustrated in FIG. 6, the third connection electrode 703 (see FIGS. 4 and 5D) is also disposed on the insulating interlayer 160. For example, the third connection electrode 703 is disposed between the insulating interlayer 160 and the planarization layer 180.

As illustrated in FIG. 6, the first connection electrode 701 is connected to the first source electrode SE1 through a first contact hole 11 passing through the insulating interlayer 160, the second gate insulating layer 150, and the first gate insulating layer 140.

As illustrated in FIG. 6, the second connection electrode 702 is connected to the first gate electrode GE1 through a second contact hole 12 passing through the insulating interlayer 160 and the second gate insulating layer 150. In addition, as illustrated in FIGS. 4, 5A, and 5D, the second connection electrode 702 is connected to the third drain electrode DE3 through a third contact hole 13. The third contact hole 13 passes through the insulating interlayer 160, the second gate insulating layer 150, and the first gate insulating layer 140 to expose the third drain electrode DE3.

As illustrated in FIGS. 4, 5A, and 5D, the third connection electrode 703 is connected to the fourth source electrode SE4 through a fourth contact hole 14. The fourth contact hole 14 passes through the insulating interlayer 160, the second gate insulating layer 150, and the first gate insulating layer 140 to expose the fourth source electrode SE4. In addition, as illustrated in FIGS. 4, 5C, and 5D, the third connection electrode 703 is connected to the initialization line IL through a fifth contact hole 15. The fifth contact hole 15 passes through the insulating interlayer 160 to expose the initialization line IL.

As illustrated in FIG. 6, the high potential line VDL is connected to the capacitor electrode 201 through a sixth contact hole 16 that passes through the insulating interlayer 160. In addition, as illustrated in FIGS. 4, 5A, and 5D, the high potential line VDL is connected to the fifth source electrode SE5 through a seventh contact hole 17. The seventh contact hole 17 passes through the insulating interlayer 160, the second gate insulating layer 150, and the first gate insulating layer 140 to expose the fifth source electrode SE5.

As illustrated in FIGS. 4, 5A, and 5D, the data line DL is connected to the second source electrode SE2 through an eighth contact hole 18. The eighth contact hole 18 passes through the insulating interlayer 160, the second gate insulating layer 150, and the first gate insulating layer 140 to expose the second source electrode SE2.

In an embodiment, the data line DL may include a refractory metal, such as any of molybdenum, chromium, tantalum, and titanium, or an alloy thereof. In an embodiment, the data line DL may have a multilayer structure including a refractory metal layer and a low-resistance conductive layer. Examples of the multilayer structure may include: a double-layer structure including a chromium or molybdenum (or alloy) lower layer and an aluminum (or alloy) upper layer; and a triple-layer structure including a molybdenum (or alloy) lower layer, an aluminum (or alloy) intermediate layer and a molybdenum (or alloy) upper layer. However, the data line DL may include any of suitable metals or conductors rather than the aforementioned materials.

In an embodiment, the first connection electrode 701, the second connection electrode 702, the third connection electrode 703 and the high potential line VDL may include a substantially same material and have a substantially same structure (e.g., a multilayer structure) as those of the data line DL. In an embodiment, each of the first connection electrode 701, the second connection electrode 702, the third connection electrode 703, the high potential line VDL, and the data line DL may be substantially simultaneously formed in a substantially same process.

As illustrated in FIG. 6, the planarization layer 180 is disposed on the first connection electrode 701, the second connection electrode 702, the third connection electrode 703, the high potential line VDL, and the data line DL.

The planarization layer 180 serves to substantially eliminate a step difference of a surface beneath the planarization layer 180 so as to increase luminous efficiency of the LED to be formed thereon. The planarization layer 180 may include at least one of the following materials: a polyacrylate resin, an epoxy resin, a phenolic resin, a polyamide resin, a polyimide resin, an unsaturated polyester resin, a polyphenylene ether resin, a polyphenylene sulfide resin, and benzocyclobutene (BCB).

The LED may be an organic light emitting diode ("OLED"). As illustrated in FIG. 6, the LED includes a light emitting layer 512, the anode electrode (herein, "a pixel electrode PE"), and the cathode electrode 613 (herein, "a common electrode").

The light emitting layer 512 includes a low molecular weight organic material or a high molecular weight organic material. Although not illustrated, at least one of a hole injection layer HIL and a hole transport layer HTL may further be provided between the pixel electrode PE and the light emitting layer 512, and at least one of an electron transport layer ETL and an electron injection layer EIL may further be provided between the light emitting layer 512 and the common electrode 613.

As illustrated in FIG. 6, the pixel electrode PE is disposed on the planarization layer 180. A portion of or all of the pixel electrode PE is disposed in a light emission area 900. That is, the pixel electrode PE is disposed corresponding to the light emission area 900 defined by an opening in the light blocking layer 190 to be described below. The pixel electrode PE is connected to the first connection electrode 701 through a ninth contact hole 19 that passes through the planarization layer 180.

In an embodiment, as illustrated in FIGS. 4 and 5E, the pixel electrode PE may have a rhombic shape. However, the pixel electrode PE may have any of various shapes, e.g., a quadrangular shape, other than the rhombic shape.

As illustrated in FIG. 6, the light blocking layer 190 is disposed on the pixel electrode PE and the planarization layer 180. The light blocking layer 190 has an opening that passes through the light blocking layer 190, and the opening corresponds to the light emission area 900. In an embodiment, as illustrated in FIGS. 4 and 5G, the light emission area 900 may have a rhombic shape. However, the light emission area 900 may have any of various shapes, e.g., a quadrangular shape, other than the rhombic shape. A size of the light emission area 900 may be less than a size of the pixel electrode PE described above. At least a portion of the pixel electrode PE is disposed at the light emission area 900. In such an embodiment, the entire light emission area 900 overlaps the pixel electrode PE.

In an embodiment, the light blocking layer 190 may include a resin, such as a polyacrylate resin or a polyimide resin.

The spacer 422 is disposed on the light blocking layer 190. In an embodiment, the spacer 422 may include a material substantially the same as a material included in the light blocking layer 190. The spacer 422 serves to substantially minimize a height difference between the layer disposed in the display area 1002*a* of the substrate 100 and the layer disposed in the non-display area 1002*b* of the substrate 100.

The light emitting layer 512 is disposed on the pixel electrode PE in the light emitting area 900, and the common electrode 613 is disposed on the light blocking layer 190 and the light emitting layer 512.

The pixel electrode PE and the common electrode 513 may include one of a transmissive electrode, a transflective electrode, and a reflective electrode.

The transmissive electrode may include a transparent conductive oxide ("TCO"). Such a TCO may include at least one selected from the group consisting of: indium tin oxide (ITO), indium zinc oxide (IZO), antimony tin oxide (ATO), aluminum zinc oxide (AZO), zinc oxide (ZnO), and a mixture thereof.

The transflective electrode and the reflective electrode may include a metal, e.g., magnesium (Mg), silver (Ag), gold (Au), calcium (Ca), lithium (Li), chromium (Cr), aluminum (Al), and copper (Cu), or an alloy thereof. In such an embodiment, whether an electrode is a transflective type or a reflective type depends on the thickness of the electrode. In an embodiment, the transflective electrode has a thickness of about 200 nm or less and the reflective electrode has a thickness of about 300 nm or more. As the thickness of the transflective electrode decreases, light transmittance and resistance increase. On the contrary, as the thickness of the transflective electrode increases, light transmittance decreases.

In addition, the transflective electrode and the reflective electrode may have a multilayer structure which includes a metal layer including a metal or a metal alloy and a TCO layer stacked on the metal layer.

The sealing unit 750 is disposed on the common electrode 613. The sealing unit 750 may include a transparent insulating substrate including glass, transparent plastic, or the like. In an embodiment, the sealing unit 750 may be formed to have a thin film encapsulation structure in which one or more inorganic layers and one or more organic layers are alternately laminated along the Z-axis direction. For example, the sealing unit 750 may include a first inorganic layer 751, an organic layer 755, and a second inorganic layer 752, as illustrated in FIG. 6. The organic layer 755 is disposed between the first inorganic layer 751 and the second inorganic layer 752. Between the first inorganic layer 751, the organic layer 755, and the second inorganic layer 752, the organic layer 755 has a largest thickness. The first inorganic layer 751 and the second inorganic layer 752 may have a substantially equal thickness.

In an embodiment, the first inorganic layer 751 and the second inorganic layer 752 may include a material substantially the same as a material included in the second layer 112 described above.

In an embodiment, the organic layer 755 may include a material substantially the same as a material included in the first layer 111. In an embodiment, the organic layer 755 may include a monomer.

The polarizing plate 800 is disposed on the sealing unit 750.

Figure 7:
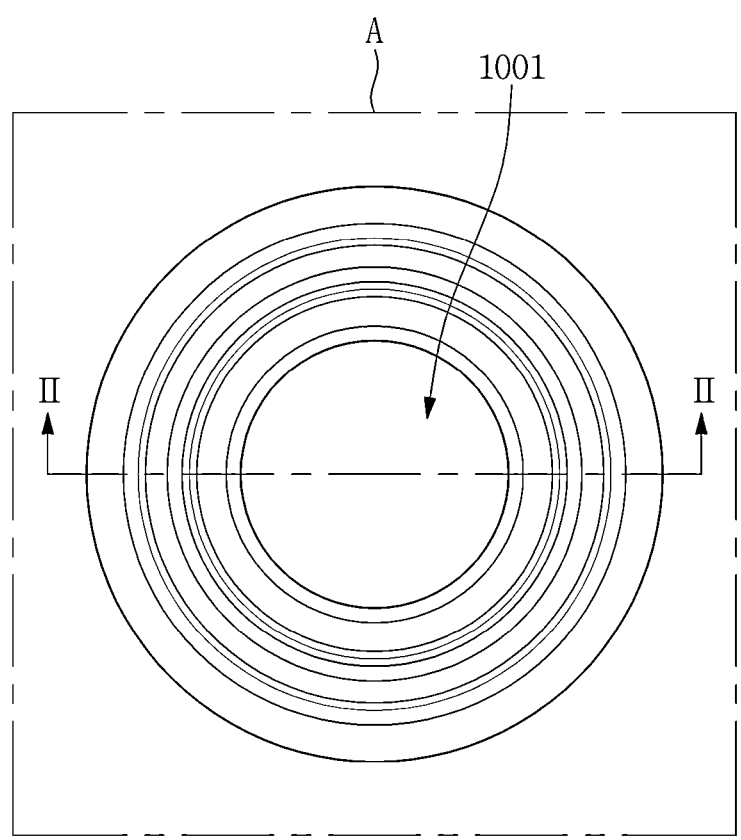
FIG. 7 is an enlarged view of a region "A" of FIG. 2.
Figure 8:
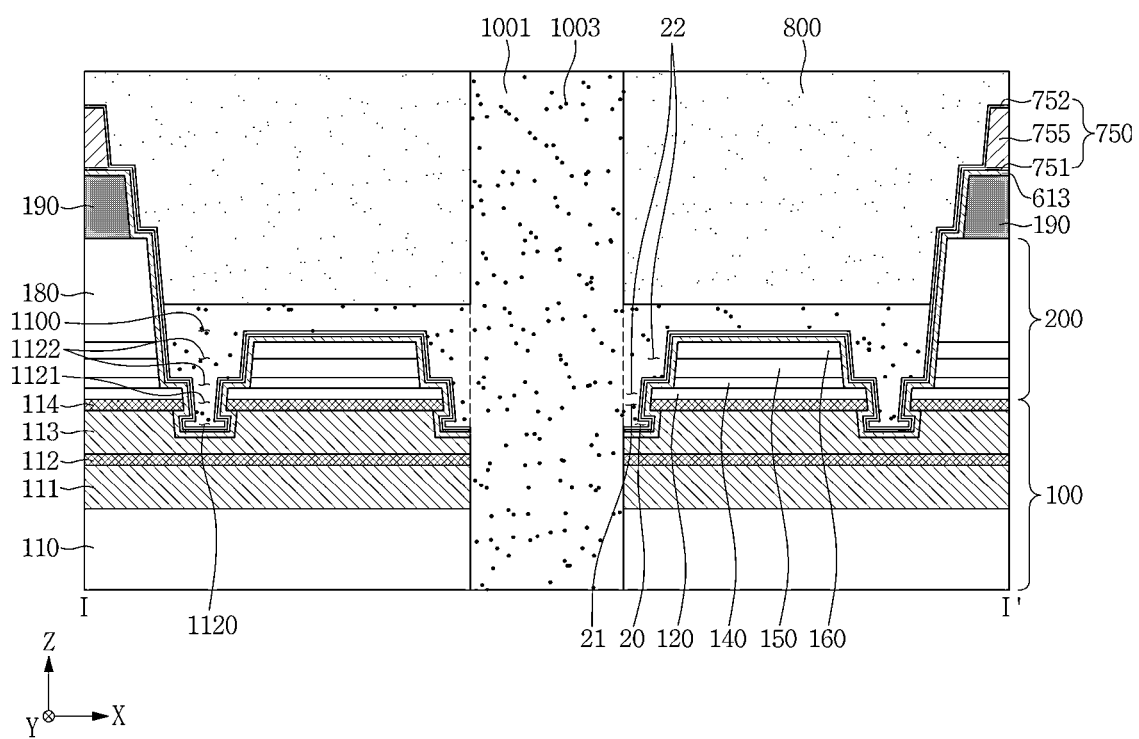
FIG. 8 is a cross-sectional view taken along the line II-II' of FIG. 7.

FIG. 7 is an enlarged view of a region "A" of FIG. 2; and FIG. 8 is a cross-sectional view taken along the line II-II' of FIG. 7.

As illustrated in FIGS. 7 and 8, the display panel 1002 has the through-hole 1001 which is defined in the non-display area 1002b and passes through the display panel 1002. The through-hole 1001 overlaps the camera module 1020 on a plane, and an inside of the through-hole 1001 is filled with the filling member 1003 which is transparent.

The filling member 1003 may include an organic material. In an embodiment, for example, the organic material may be an acrylic silicon-based organic material.

In an embodiment, the filling member 1003 may include a first inorganic material, an organic material, and a second inorganic material that are sequentially stacked. In an embodiment, for example, the first inorganic material and the second inorganic material may be at least one of silicon nitride ($SiN_x$), silicon oxide ($SiO_2$), and silicon oxynitride ($SiO_xN_y$). In an embodiment, the organic material may be an acrylic silicon-based organic material.

In a peripheral area of a size (e.g., a predetermined size) surrounding the through-hole 1001 in the non-display area 1002b, the display panel 1002 includes the substrate 100, the pixel circuit unit 200, the common electrode 613, the first inorganic layer 751 and the second inorganic layer 752 of the sealing unit 750, and the polarizing plate 800.

The substrate 100 and the pixel circuit unit 200 have a hole or a depression at a portion thereof corresponding to the through-hole 1001 in the non-display area 1002b. For example, as illustrated in FIG. 8, the substrate 100 has a second hole 21 and a depression 20 defined corresponding to the through-hole 1001. The pixel circuit unit 200 has a first hole 22 defined corresponding to the through-hole 1001.

The depression 20 of the substrate 100 may be defined in the third layer 113 of the substrate 100, for example. The depression 20 is defined in a layer lower than the switching element (for example, at least one of T1 to T7) of the pixel circuit unit 200. For example, the depression 20 is defined closer to the base layer 110 than the switching element is thereto. As a more specific example, a distance between the depression 20 and the base layer 110 measured in the Z-axis direction is less than a distance between the semiconductor layer 321 of the switching element and the base layer 110 measured in the Z-axis direction.

The second hole 21 of the substrate 100 may be defined, for example, in the fourth layer 114 of the substrate 100.

The first hole 22, the second hole 21, and the depression 20 are located corresponding to each other. In addition, adjacent ones of the first hole 22, the second hole 21, and the depression 20 are connected to each other.

The second hole 21 may be defined between the depression 20 and the first hole 22.

In an embodiment, the depression 20 has a width (or diameter) gradually widening along a direction (for example, the Z-axis direction) from the third layer 113 toward the fourth layer 114. The width (or diameter) of the depression 20 is a value measured in the X-axis direction (or the Y-axis direction). In such an embodiment, the width (or diameter) of the depression 20 means the maximum width (or maximum diameter) or average width (or average diameter) of the depression 20.

In an embodiment, the second hole 21 has a width (or diameter) gradually widening along the Z-axis direction. The width (or diameter) of the second hole 21 is a value measured in the X-axis direction (or the Y-axis direction). In such an embodiment, the width (or diameter) of the second hole 21 means the maximum width (or maximum diameter) or average width (or average diameter) of the second hole 21.

In an embodiment, the first hole 22 has a width (or diameter) gradually widening along the Z-axis direction. The width (or diameter) of the first hole 22 is a value measured in the X-axis direction (or the Y-axis direction). In such an embodiment, the width (or diameter) of the first hole 22 means the maximum width (or maximum diameter) or average width (or average diameter) of the first hole 22.

The first hole 22 means a hole that continuously passes through the insulating layers included in the pixel circuit unit 200. For example, the first hole 22 refers to a hole that continuously passes through the buffer layer 120, the first gate insulating layer 140, the second gate insulating layer 150, and the insulating interlayer 160. In an embodiment, for example, the first hole 22 has a hole (herein, "a buffer hole") that passes through the buffer layer 120, a hole (herein, "a firstgate hole") that passes through the first gate insulating layer 140, a hole (herein, "a second gate hole") that passes through the second gate insulating layer 150, and a hole (herein, "an interlayer hole") that passes through the insulating interlayer 160.

In an embodiment, the buffer hole, the first gate hole, the second gate hole, and the interlayer hole may have widths (or diameters) different from each other. For example, the holes included in the first hole 22 may have a larger width (or diameter), farther away from the substrate 100 in the Z-axis direction. As a specific example, between the buffer hole, the first gate hole, the second gate hole, and the interlayer hole, the interlayer hole may have the largest width (or diameter). The width (or diameter) of each hole included in the first hole 22 is a value measured in the X-axis direction (or the Y-axis direction). In such an embodiment, the width (or diameter) of each hole included in the first hole 22 means the maximum width (or maximum diameter) or average width (or average diameter) of the corresponding hole.

In an embodiment, each hole (the buffer hole, the first gate hole, the second gate hole, and the interlayer hole) itself included in the first hole 22 may have a width (or diameter) gradually widening along the Z-axis direction.

The width (or diameter) of the depression 20 is larger than the width (or diameter) of the second hole 21.

The width (or diameter) of the first hole 22 is larger than the width (or diameter) of the second hole 21.

The filling member 1003 is filled not only in the through-hole 1001 but also in the first hole 22, the second hole 21, and the depression 20 of the substrate 100 and the pixel circuit unit 200. In an embodiment, the filling member 1003 may also be filled in a void space between the sealing unit 750 and the polarizing plate 800.

In such an embodiment, since the width (or diameter) of the depression 20 is larger than the width (or diameter) of the second hole 21, the filling member 1003 filled in the first hole 22, the second hole 21, and the depression 20 is not well separated in the Z-axis direction. Accordingly, the bonding force between and the substrate 100 and the sealing unit 750 around the through-hole 1001 may be improved.

The through-hole 1001 is located corresponding to the first hole 22, the second hole 21, and the depression 20 to pass through upper and lower structures of the first hole 22, the second hole 21, and the depression 20. For example, the through-hole 1001 passes through the substrate 100, the common electrode 613, the sealing unit 750, and the polarizing plate 800.

The display panel 1002 has a first depression 1100 that is located at the non-display area 1002*b* and neighbors the through-hole 1001. An inside of the first depression 1100 is filled with a filling member 1003 which is transparent. The filling member 1003 located in the first depression 1100 at a vertical position comprises a material substantially the same as a material comprised in the filling member 1003 located in the through-hole 1001 at the vertical position. That is, the filling member located in the first depression and the filling member 1003 located in the through-hole 1001 comprise a substantially same material for each vertical height at one vertical position.

The filling member 1003 filled in the first depression 1100 may include an organic material, as in the filling member 1003 filled in the through-hole 1001. In an embodiment, for example, the organic material may be an acrylic silicon-based organic material.

In an embodiment, the filling member 1003 filled in the through-hole 1001 may include a first inorganic material, an organic material, and a second inorganic material that are sequentially stacked. In an embodiment, for example, the filling member 1003 filled in the first depression 1100 may include one or more of the stacked materials of the filling member 1003. For example, the first inorganic material and the second inorganic material may be at least one of silicon nitride ($SiN_x$), silicon oxide ($SiO_2$), and silicon oxynitride ($SiO_xN_y$). In an embodiment, the organic material may be an acrylic silicon-based organic material.

In a peripheral area of a predetermined size that surrounds the first depression 1100 in the non-display area 1002*b*, the display panel 1002 includes the substrate 100, the pixel circuit unit 200, the common electrode 613, the first inorganic layer 751 and the second inorganic layer 752 of the sealing unit 750, and the polarizing plate 800.

The substrate 100 and the pixel circuit unit 200 has, at the non-display area 1002*b*, a second depression 1120, a first hole 1122, and a second hole 1121 that correspond to the first depression 1100. The second depression 1120, the first hole 1122, and the second hole 1121 are located corresponding to each other. In addition, adjacent ones of the first hole 1122, the second hole 1121, and the second depression 1120 communicate with each other. The second hole 1121 may be located between the second depression 1120 and the first hole 1122.

In an embodiment, for example, as illustrated in FIG. 8, the substrate 100 has the second hole 1121 and the second depression 1120 that are located corresponding to the first depression 1100, and the pixel circuit unit 200 has the second hole 1121 that is located corresponding to the first depression 1100. The second depression 1120 may be disposed, for example, on the third layer 113 of the substrate 100. The second depression 1120 may be located at a vertical position substantially the same as a vertical position of the depression 20 of the through-hole 1001 with respect to a lower surface of the substrate 100.

In an embodiment, the second depression 1120 has a width (or diameter) gradually widening along a direction from the third layer 113 toward the fourth layer 114 (e.g., the Z-axis direction), which is similar to the depression 20.

The second hole 1121 has a width (or diameter) gradually widening along the Z-axis direction, which is similar to the second hole 21 of the through-hole 1001.

The first hole 1122 has a width (or diameter) gradually widening along the Z-axis direction, which is similar to the first hole 22 of the through-hole 1001.

The first hole 1122 means a hole that continuously passes through the insulating layers included in the pixel circuit unit 200. For example, the first hole 1122 refers to a hole that continuously passes through the buffer layer 120, the first gate insulating layer 140, the second gate insulating layer 150, and the insulating interlayer 160. In an embodiment, for example, the first hole 1122 has a hole (herein, "a buffer hole") that passes through the buffer layer 120, a hole (herein, "a first gate hole") that passes through the first gate insulating layer 140, a hole (herein, "a second gate hole") that passes through the second gate insulating layer 150, and a hole (herein, "an interlayer hole") that passes through the insulating interlayer 160.

In an embodiment, the buffer hole, the first gate hole, the second gate hole, and the interlayer hole may have widths (or diameters) different from each other. For example, the holes included in the first hole 1122 may have a larger width (or diameter), farther away from the substrate 100 in the Z-axis direction. As a specific example, between the buffer hole, the first gate hole, the second gate hole, and the interlayer hole, the interlayer hole may have the largest width (or diameter). The width (or diameter) of each hole included in the first hole 1122 is a value measured in the X-axis direction (or the Y-axis direction). In such an embodiment, the width (or diameter) of each hole included in the first hole 1122 means the maximum width (or maximum diameter) or average width (or average diameter) of the corresponding hole.

In an embodiment, each hole (the buffer hole, the first gate hole, the second gate hole, and the interlayer hole) itself included in the first hole 1122 may have a width (or diameter) gradually widening along the Z-axis direction.

The width (or diameter) of the second depression 1120 is larger than the width (or diameter) of the second hole 1121.

The width (or diameter) of the first hole 1122 is larger than the width (or diameter) of the second hole 1121.

The filling member 1003 is filled not only in the through-hole 1001 but also in the first hole 1122, the second hole 1121, and the second depression 1120 of the substrate 100 and the pixel circuit unit 200. In an embodiment, the filling member 1003 may also be filled in a void space between the sealing unit 750 and the polarizing plate 800.

In such an embodiment, since the width (or diameter) of the second depression 1120 is larger than the width (or diameter) of the second hole 1121, the filling member 1003 filled in the first hole 1122, the second hole 1121, and the second depression 1120 is not well separated in the Z-axis direction. Accordingly, the bonding force between and the substrate 100 and the sealing unit 750 around the through-hole 1001 may be improved.

FIGS. 9A to 9D are cross-sectional views for explaining a method of manufacturing a display device according to an embodiment of the present invention. FIGS. 9A to 9D will be described with respect to a method of forming a structure in the non-display area 1002*b* in which the through-hole 1001 is defined.

Figure 9A:
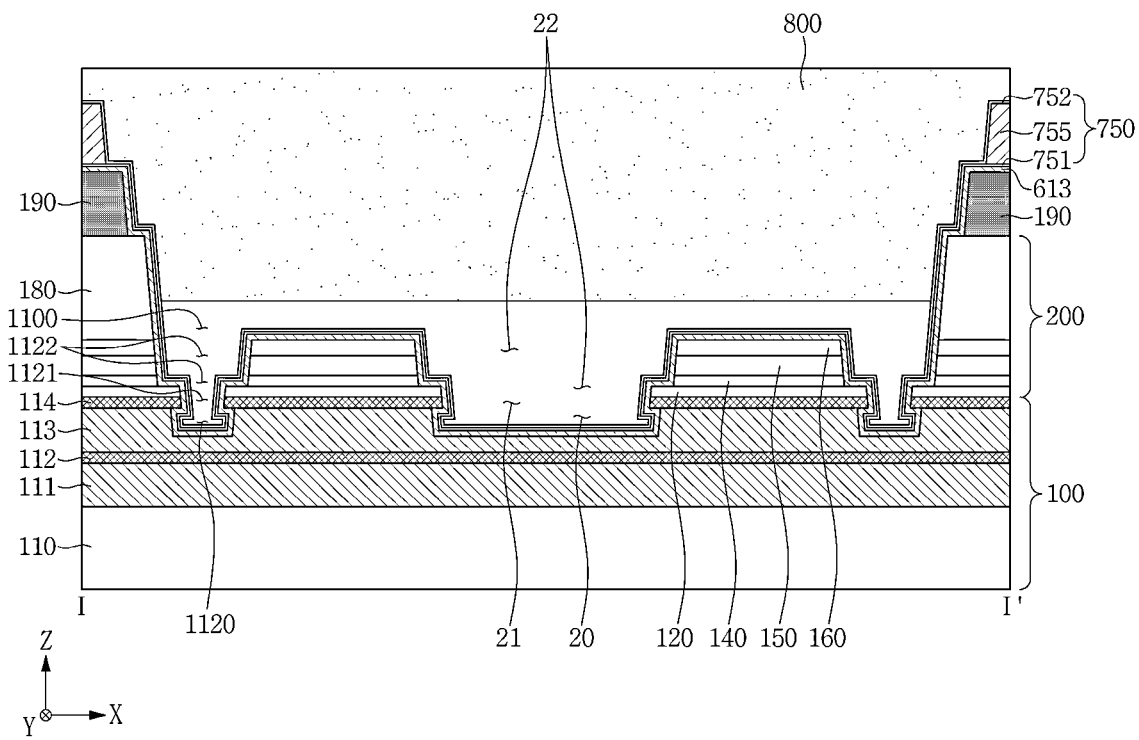
FIGS. 9A to 9D are cross-sectional views for explaining a method of manufacturing a display device according to an embodiment of the present invention.

First, as illustrated in FIG. 9A, the first layer 111, the second layer 112, the third layer 113, the fourth layer 114, the buffer layer 120, the first gate insulating layer 140, the second gate insulating layer 150, and the insulating interlayer 160 are sequentially formed on a carrier substrate (not illustrated).

Although not illustrated, in the case of the display area 1002*a*, the semiconductor layer 321 is further formed between the buffer layer 120 and the first gate insulating layer 140, and the planarization layer 180, the pixel electrode PE, and the light blocking layer 190 are further formed sequentially on the insulating interlayer 160.

In addition, although not illustrated, in the case of the display area 1002*a*, the first gate electrode GE1, the second gate electrode GE2, the third gate electrode GE3, the fourth gate electrode GE4, the fifth gate electrode GE5, the sixth gate electrode GE6, the seventh gate electrode GE7, the (n−1)-th scan line SLn−1, the n-th scan line SLn, the (n+1)-th scan line SLn+1, the emission control line EL, the initialization line IL, the capacitor electrode 201, the first connection electrode 701, the second connection electrode 702, the third connection electrode 703, the data line DL, and the high potential line VDL are further formed on a carrier substrate (not illustrated).

Next, as illustrated in FIG. 9A, portions of the insulating interlayer 160, the second gate insulating layer 150, and the first gate insulating layer 140 are selectively removed through an etching process. Accordingly, the first hole 22 exposing the buffer layer 120 is defined.

In an embodiment, each of the insulating interlayer 160, the second gate insulating layer 150, and the first gate insulating layer 140 may be removed by a dry-etching method using an etching gas.

Next, as illustrated in FIG. 9A, portions of the buffer layer 120 and the fourth layer 114 are selectively removed through an etching process. Accordingly, the second hole 21 exposing the third layer 113 is defined.

In an embodiment, each of the buffer layer 120 and the fourth layer 114 described above may be removed by a dry-etching method using an etching gas.

Since the buffer layer 120 and the fourth layer 114 include inorganic materials, they may be removed by the aforementioned dry-etching method. However, since the third layer 113 beneath the fourth layer 114 includes an organic material, the third layer 113 may not be removed well by a typical dry-etching method.

Thereafter, as illustrated in FIG. 9A, a portion of a surface of the third layer 113 is selectively removed by an etching process. Accordingly, the depression 20 is defined in an exposed surface of the third layer 113.

In an embodiment, the third layer 113 includes an organic material, and the third layer 113 may be removed through an etching process using oxygen ($O_2$) gas (e.g., oxygen etching or oxygen ashing). Accordingly, in the oxygen etching process, a side surface of the fourth layer 114 (i.e., the surface exposed by the second hole 21) is not removed, and only the third layer 113 including or being formed of an organic material may be selectively removed.

As the oxygen etching time increases, the third layer 113 is removed more to increase the width of the depression 20. In an embodiment, since the fourth layer 114 is not substantially removed during the oxygen etching process, the width of the second hole 21 is substantially maintained. When the oxygen etching time is sufficiently long and the width of the depression 20 of the third layer 113 becomes larger than the width of the second hole 21, an under-cut phenomenon occurs in which the depression 20 extends below the fourth layer 114. In other words, if the oxygen etching is performed for a long time to such an extent that the under-cut phenomenon occurs in the third layer 113, the depression 20 of the third layer 113 may have a width larger than the width of the second hole 21.

Next, as illustrated in FIG. 9A, the common electrode 613 is formed. The common electrode 613 is formed along inner walls of the first hole 22, the second hole 21, and the depression 20.

Although not illustrated, in the case of the display area 1002*a*, the light emitting layer 512 is formed on the pixel electrode PE before the common electrode 613 is formed. The common electrode 613 is formed on the light blocking layer 190 and the light emitting layer 512.

Next, as illustrated in FIG. 9A, the sealing unit 750 is formed on the common electrode 613. In the non-display area 1002*b*, the sealing unit 750 includes the first inorganic layer 751 and the second inorganic layer 752. For example, the first inorganic layer 751 is formed on the common electrode 613, and the second inorganic layer 752 is formed on the first inorganic layer 751.

Although not illustrated, in the case of the display area 1002*a*, the organic layer 755 is further formed between the first inorganic layer 751 and the second inorganic layer 752.

Then, as illustrated in FIG. 9A, the polarizing plate 800 is formed on the sealing unit 750. There may be defined a void space between the sealing unit 750 and the polarizing plate 800.

Next, as illustrated in FIG. 9A, a carrier substrate (not illustrated) is removed from the first layer 111, and the base layer 110 is attached to the first layer 111.

Figure 9B:
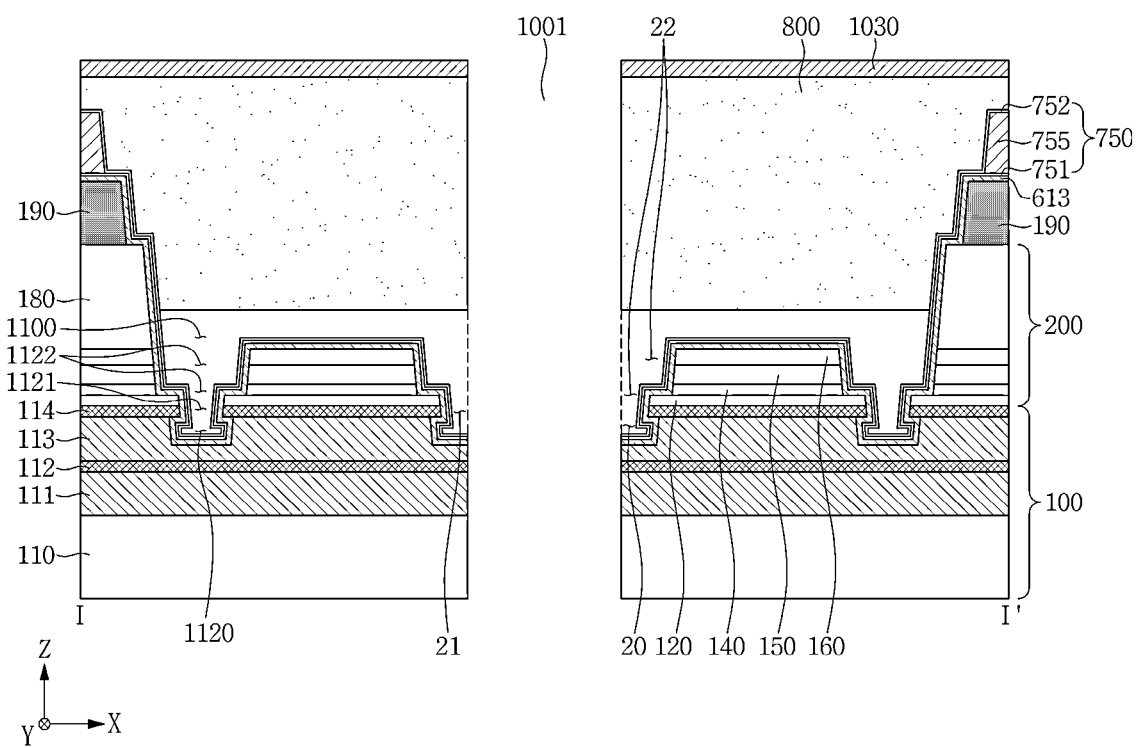

Next, as illustrated in FIG. 9B, the adhesive unit 1030 is disposed on the polarizing plate 800 of the display panel 1002 which is manufactured as described above.

Next, as illustrated in FIG. 9B, the through-hole 1001 that passes through upper and lower structures of the first holes 22, the second holes 21, and the depression 20 is defined corresponding to the first hole 22, the second hole 21, and the depression 20. For example, the through-hole 1001 that passes through the substrate 100, the common electrode 613, the sealing unit 750, the polarizing plate 800, and the adhesive unit 1030 is defined.

The first hole 1122, the second hole 1121, and the second depression 1120 of the first depression 1100 may be defined in a method substantially the same as a method according to an embodiment in which the first hole 22, the second hole 22, and the groove 20 of the through-hole 1101 are defined. In an embodiment, for example, the first hole 1122 of the first depression 1100 may be etched, while etching the first hole 22 of the through-hole 1101. In an embodiment, for example, the second hole 1121 of the first depression 1100 may be etched, while etching the second hole 21 of the through-hole 1101. In an embodiment, for example, the second depression 1120 of the first depression 1100 may be etched, while etching the depression 20 of the through-hole 1101.

Figure 9C:
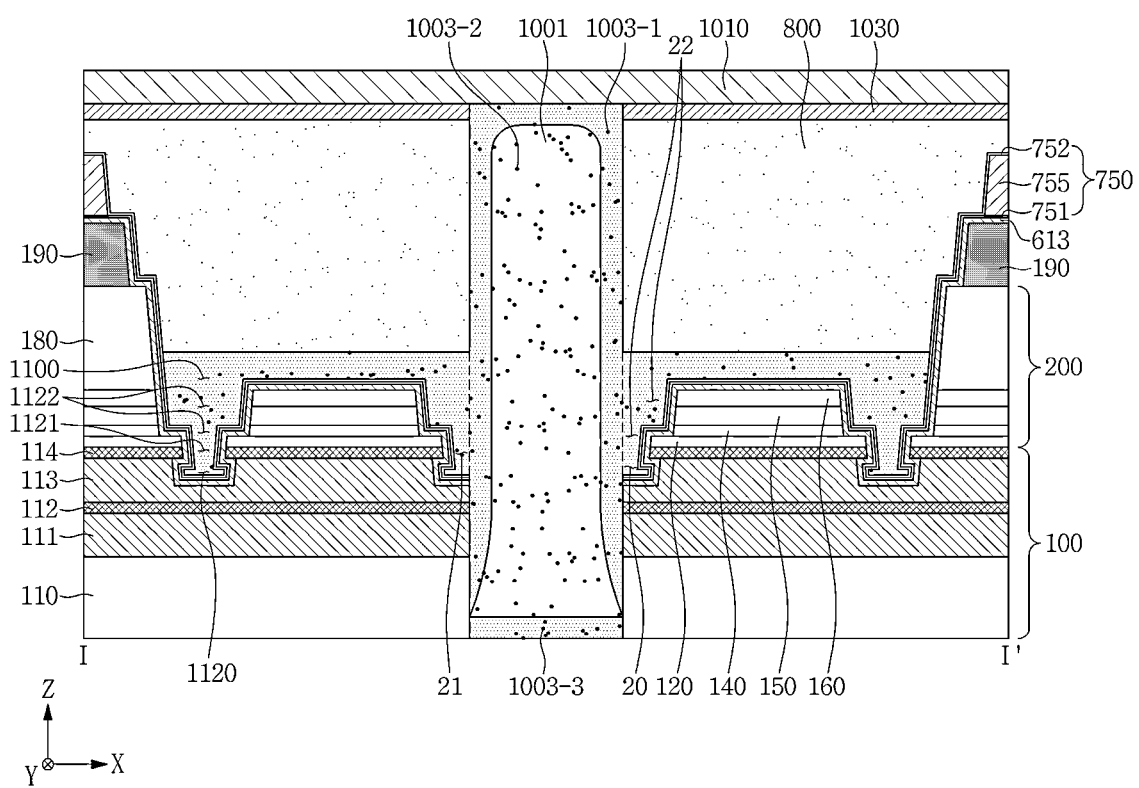

Then, as illustrated in FIG. 9C, the window glass 1010 and the display panel 1002 defined with the through-hole 1001 are attached to each other through the adhesive unit 1030.

The filling member 1003 is then filled in the above-defined through-hole 1001, as illustrated in FIG. 9C. It is illustrated in FIG. 9C that the filling member 1003 includes a first inorganic material 1003-1, an organic material 1003-2, and a second inorganic material 1003-3 which are sequentially stacked. However, in an embodiment, the filling member 1003 may only include the organic material 1003-2. In an embodiment, for example, the first inorganic material 1003-1 and the second inorganic material 1003-3 may be filled through a chemical vapor deposition (CVD) process, and the organic material 1003-2 may be filled in a liquid phase process.

Accordingly, one end portion of the filling member 1003 is disposed opposing the window glass 1010.

The filling member 1003 may be filled not only in the through-hole 1001 but also in the first hole 22, the second hole 21, and the depression 20 of the substrate 100 and the pixel circuit unit 200. In addition, the filling member 1003 may be filled in the first hole 1122, the second hole 1121, and the second depression 1120 of the first depression 1100. In addition, the filling member 1003 may also be filled in the void space between the sealing unit 750 and the polarizing plate 800.

Figure 9D:
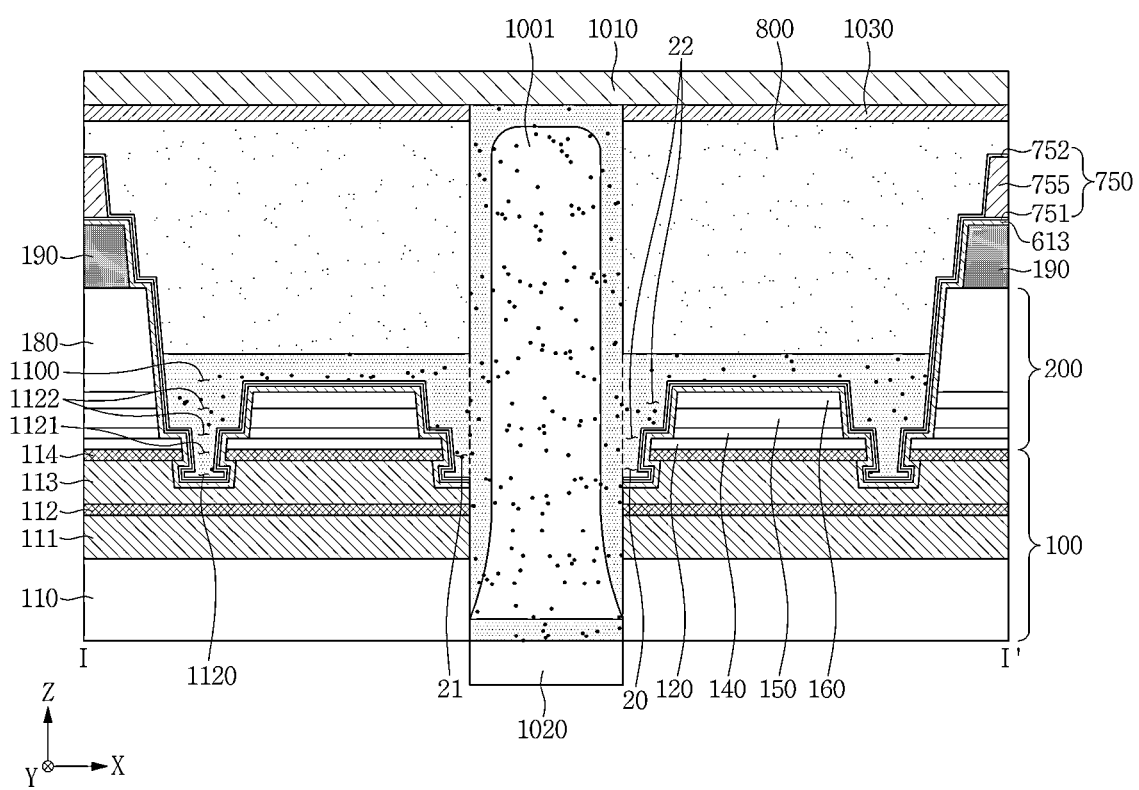

Next, as illustrated in FIG. 9D, the camera module 1020 is disposed at another end portion of the filling member 1003. Accordingly, another end portion of the filling member 1003 is disposed opposing the camera module 1020.

The filling member 1003 filled in the through-hole 1001 and the lens of the camera module 1020 may contact each other such that there is no air gap between the filling member 1003 and the lens. In an embodiment, when the filling member 1003 includes the first inorganic material 1003-1, the organic material 1003-2, and the second inorganic material 1003-3 that are sequentially stacked, the filling member 1003 may be UV-cured in a state that the second inorganic material 1003-3 contacts the lens so as to bring the filling member 1003 and the lens in contact with each other. In an embodiment, when the filling member 1003 only includes the organic material 1003-2, since the organic material has adhesive characteristics, the filling material 1003 and the lens may be brought into contact with each other, without a separate UV curing process, by allowing the organic material 1003-2 and the lens to contact each other.

In an embodiment, the filling member 1003 filled in the through-hole 1001 and the lens of the camera module 1020 may not contact each other.

Figure 10:
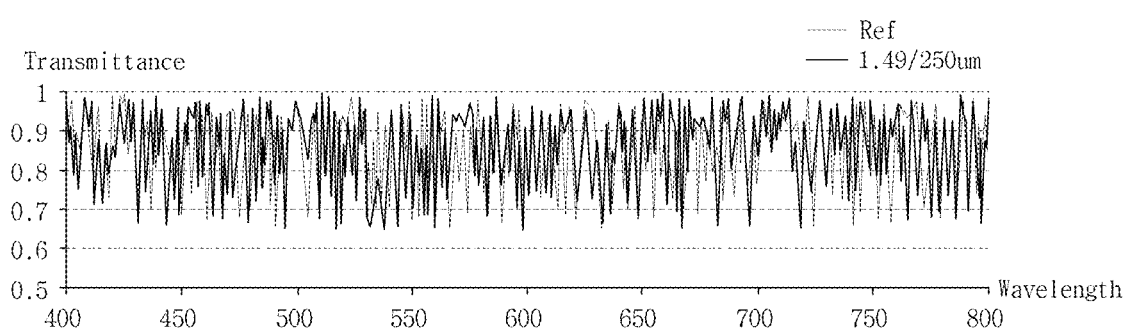
FIG. 10 is a graph showing transmittance of light incident to a lens of a camera module when there is an air gap between a filling member and the lens in a display device according to an embodiment of the present invention.
Figure 11:
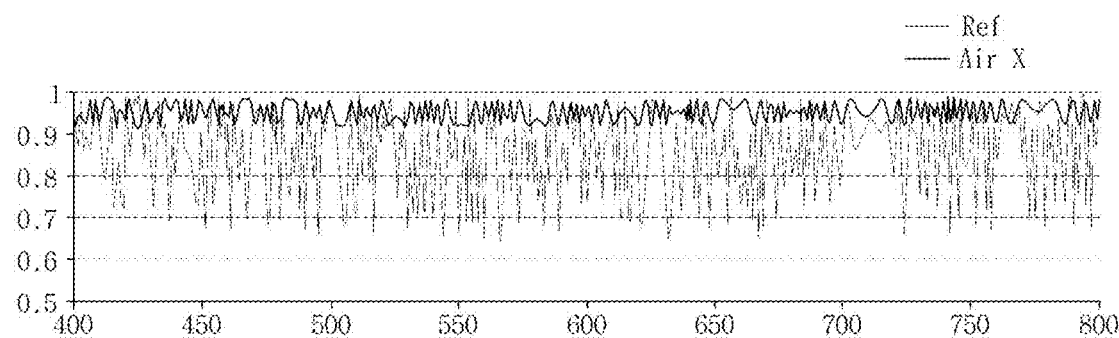
FIG. 11 is a graph showing transmittance of light incident to the lens of the camera module when there is no air gap between the filling member and the lens in a display device according to an embodiment of the present invention.

FIG. 10 is a graph showing transmittance of light incident to the lens of the camera module 1020 when there is an air gap between the filling member 1003 and the lens in a display device according to an embodiment of the present invention; and FIG. 11 is a graph showing transmittance of light incident to the lens of the camera module 1020 when there is no air gap between the filling member 1003 and the lens in a display device according to an embodiment of the present invention. In such an embodiment, the refractive index of the filling member is about 1.3.

When the through-hole 1001 is filled with the filling member 1003 but there is an air gap between the filling member 1003 and the lens of the camera module 1020, a large variation appears in the transmittance of light incident to the lens according to the wavelength. Accordingly, it may be appreciated that when there is an air gap between the filling member 1003 and the lens of the camera module 1020, the distortion of light incident to the lens is not largely improved, as compared with a case in which the filling member 1003 is not filled in the through-hole 1001 (Ref).

On the other hand, when the filling member 1003 is filled in the through-hole 1001 and there is no air gap between the filling member 1003 and the lens of the camera module 1020, as illustrated in FIG. 11, a relatively small variation appears in the transmittance of light incident to the lens according to the wavelength. The transmittance according to the wavelength is about 90% or more. Accordingly, it may be appreciated that when there is no air gap between the filling member 1003 and the lens of the camera module 1020, the distortion of light incident to the lens is significantly improved, as compared with a case in which the filling member 1003 is not filled in the through-hole 1001 (Ref).

As set forth herein, a display device and a method of manufacturing the display device according to one or more embodiments may provide the following effects.

As for the display device of the present invention, a filling member is filled in a through-hole defined in the display panel. Accordingly, the reliability (e.g., impact resistance) of the display panel having the through-hole may be improved.

A refractive index difference between one end portion of the filling member and a lens of a camera module and a refractive index difference between another end portion of the filling member and the window glass are lowered by using the filling member. Accordingly, the distortion of light incident to the lens of the camera module may be improved, and the transmittance and visibility may be further improved.

In embodiments, the filling member and the lens of the camera module contact each other. Accordingly, there is no air gap between the filling member and the lens of the camera module, and the distortion of light incident to the lens of the camera module may be improved without additional index matching due to the presence of an air gap.

The filling member is filled in a depression or hole of the substrate (e.g., in the pixel circuit unit). Accordingly, the bonding force between a sealing unit around the through-hole and the substrate may be improved.

While the present invention has been illustrated and described with reference to some embodiments thereof, it will be apparent to those of ordinary skill in the art that various changes in form and detail may be made thereto without departing from the spirit and scope of the present invention.

What is claimed is:

1. A display device comprising:
   a camera module comprising at least one lens;
   a display panel comprising a through-hole;
   a window glass on the display panel; and
   a filling member in the through-hole and opposing the window glass,
   wherein the through-hole overlaps the camera module,
   the filling member opposes the camera module,
   a refractive index difference between an end portion of the filling member and a lens of the at least one lens is about 0.7 or less, and
   a refractive index difference between another end portion of the filling member and the window glass is about 0.5 or less, and
   wherein the display panel comprises:
   a substrate; and a pixel circuit unit on the substrate and comprising a first hole, the substrate comprises: a first layer comprising a depression corresponding to the first hole; and a second layer between the first layer and the pixel circuit unit and comprising a second hole defined between the depression and the first hole, and the depression has a width larger than a width of the second hole.

2. The display device of claim 1, wherein the filling member has a refractive index in a range from about 1.2 to about 2.0.

3. The display device of claim 1, wherein the filling member comprises an organic material.

4. The display device of claim 1, wherein the filling member comprises a first inorganic material, an organic material, and a second inorganic material which are sequentially stacked, the first inorganic material opposes the camera module, and the second inorganic material opposes the window glass.

5. The display device of claim 1, wherein the filling member contacts the lens of the camera module.

6. The display device of claim 1, wherein the display panel further comprises:

a common electrode on the pixel circuit unit;

a sealing unit on the common electrode; and a polarizing plate on the sealing unit, and the through-hole is located corresponding to the first hole, the second hole, and the depression, and passes through the substrate, the common electrode, the sealing unit, and the polarizing plate.

7. The display device of claim 6, further comprising: an adhesive unit between the display panel and the window glass, wherein the through-hole passes through the adhesive unit.

8. The display device of claim 6, wherein the depression has a width gradually widening along a direction from the first layer toward the second layer.

9. A display device comprising:

a camera module comprising at least one lens;

a display panel comprising a through-hole;

a window glass on the display panel; and a filling member in the through-hole and opposing the window glass, wherein the through-hole overlaps the camera module, the filling member contacts a lens of the at least one lens, and the filling member has a refractive index between a refractive index of the window glass and a refractive index of the lens.

10. The display device of claim 9, wherein the refractive index of the filling member is in a range from about 1.2 to about 2.0.

11. The display device of claim 9, wherein the filling member comprises an organic material.

12. The display device of claim 11, wherein a refractive index difference between an end portion of the filling member and the lens is about 0.7 or less, and a refractive index difference between another end portion of the filling member and the window glass is about 0.5 or less.

13. The display device of claim 9, wherein the filling member comprises a first inorganic material, an organic material, and a second inorganic material which are sequentially stacked, the first inorganic material opposes the camera module, and the second inorganic material opposes the window glass.

14. The display device of claim 13, wherein a refractive index difference between the first inorganic material and the lens is about 0.7 or less, and a refractive index difference between the second inorganic material and the window glass is about 0.5 or less.

15. The display device of claim 9, wherein the display panel comprises:

a substrate;

a pixel circuit unit on the substrate and comprising a first hole;

a common electrode on the pixel circuit unit;

a sealing unit on the common electrode; and a polarizing plate on the sealing unit, the substrate comprises: a first layer comprising a depression corresponding to the first hole; and a second layer between the first layer and the pixel circuit unit and comprising a second hole defined between the depression and the first hole, the depression has a width larger than a width of the second hole, and the through-hole is located corresponding to the first hole, the second hole, and the depression, and passes through the substrate, the common electrode, the sealing unit, and the polarizing plate.

16. The display device of claim 15, further comprising: an adhesive unit between the display panel and the window glass, wherein the through-hole passes through the adhesive unit.

17. The display device of claim 15, wherein the depression has a width gradually widening along a direction from the first layer toward the second layer.

* * * * *